(12) United States Patent
Staals et al.

(10) Patent No.: US 10,691,030 B2
(45) Date of Patent: Jun. 23, 2020

(54) MEASUREMENT METHOD, INSPECTION APPARATUS, PATTERNING DEVICE, LITHOGRAPHIC SYSTEM AND DEVICE MANUFACTURING METHOD

(71) Applicant: ASML NETHERLANDS B.V., Veldhoven (NL)

(72) Inventors: Frank Staals, Eindhoven (NL); Eric Jos Anton Brouwer, Weert (NL); Carlo Cornelius Maria Luijten, Duizel (NL); Jean-Pierre Agnes Henricus Marie Vaessen, Echt (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/192,853

(22) Filed: Nov. 16, 2018

(65) Prior Publication Data
US 2019/0171114 A1     Jun. 6, 2019

(30) Foreign Application Priority Data

Dec. 4, 2017   (EP) .................................... 17205144
Apr. 3, 2018   (EP) .................................... 18165518
Jun. 5, 2018   (EP) .................................... 18175874

(51) Int. Cl.
*G03F 7/20*     (2006.01)
*G01N 21/956*   (2006.01)
*G01N 21/47*    (2006.01)

(52) U.S. Cl.
CPC ..... *G03F 7/70625* (2013.01); *G01N 21/4788* (2013.01); *G01N 21/956* (2013.01);
(Continued)

(58) Field of Classification Search
CPC .............. G01N 21/4788; G01N 21/956; G03F 7/70625; G03F 7/70633; G03F 7/70641; G03F 7/70683
(Continued)

(56) References Cited

U.S. PATENT DOCUMENTS

| 5,856,052 A | 1/1999 | Leroux |
| 2006/0033921 A1 | 2/2006 | Den Boef et al. |

(Continued)

FOREIGN PATENT DOCUMENTS

| EP | 3447580 | 2/2019 |
| WO | 2013178422 | 12/2013 |
| WO | 2016198283 | 12/2016 |

OTHER PUBLICATIONS

Taiwanese Office Action issued in corresponding Taiwanese Patent Application No. 107142848, dated Jul. 24, 2019.

*Primary Examiner* — Tri T Ton
(74) *Attorney, Agent, or Firm* — Pillsbury Winthrop Shaw Pittman LLP

(57) ABSTRACT

A focus metrology target includes one or more periodic arrays of features. A measurement of focus performance of a lithographic apparatus is based at least in part on diffraction signals obtained from the focus metrology target. Each periodic array of features includes a repeating arrangement of first zones interleaved with second zones, a feature density being different in the first zones and the second zones. Each first zone includes a repeating arrangement of first features. A minimum dimension of each first feature is close to but not less than a resolution limit of the printing by the lithographic apparatus, so as to comply with a design rule in a given process environment. A region of high feature density may further include a repeating arrangement of larger features.

20 Claims, 17 Drawing Sheets

(52) U.S. Cl.
CPC ...... *G03F 7/70633* (2013.01); *G03F 7/70641* (2013.01); *G03F 7/70683* (2013.01)

(58) Field of Classification Search
USPC .................................................. 356/600–640
See application file for complete search history.

(56) References Cited

U.S. PATENT DOCUMENTS

| | | |
|---|---|---|
| 2006/0066855 A1 | 3/2006 | Den Boef et al. |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0099526 A1* | 4/2011 | Liu ........................ G03F 1/144 716/54 |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2014/0315330 A1* | 10/2014 | Fujimori ............ G03F 7/70641 438/7 |
| 2016/0334715 A1 | 11/2016 | Smilde et al. |
| 2016/0363871 A1 | 12/2016 | Van Oosten et al. |
| 2017/0176870 A1 | 6/2017 | Hinnen et al. |
| 2019/0056673 A1 | 2/2019 | Li et al. |

* cited by examiner

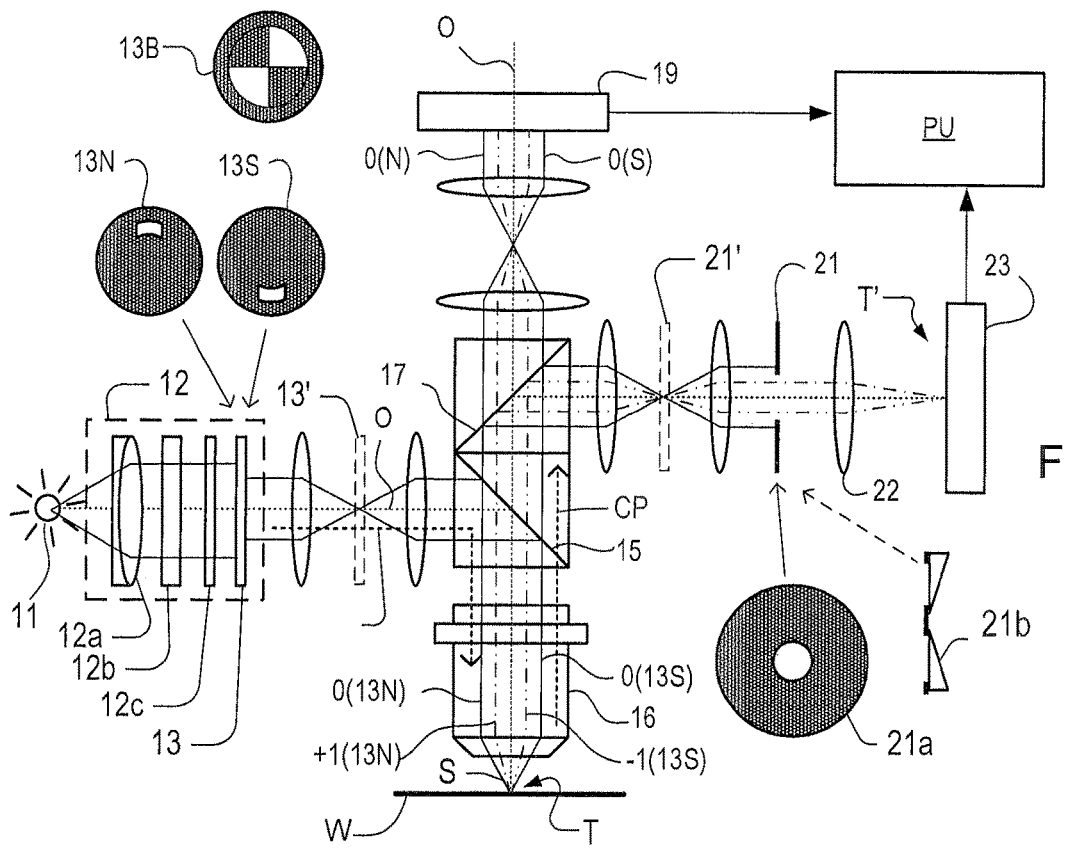
Fig. 5A
Fig. 5B
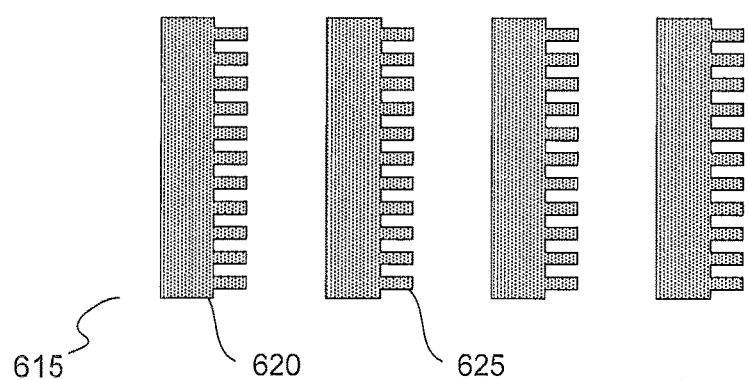
Fig. 6 (Prior Art)

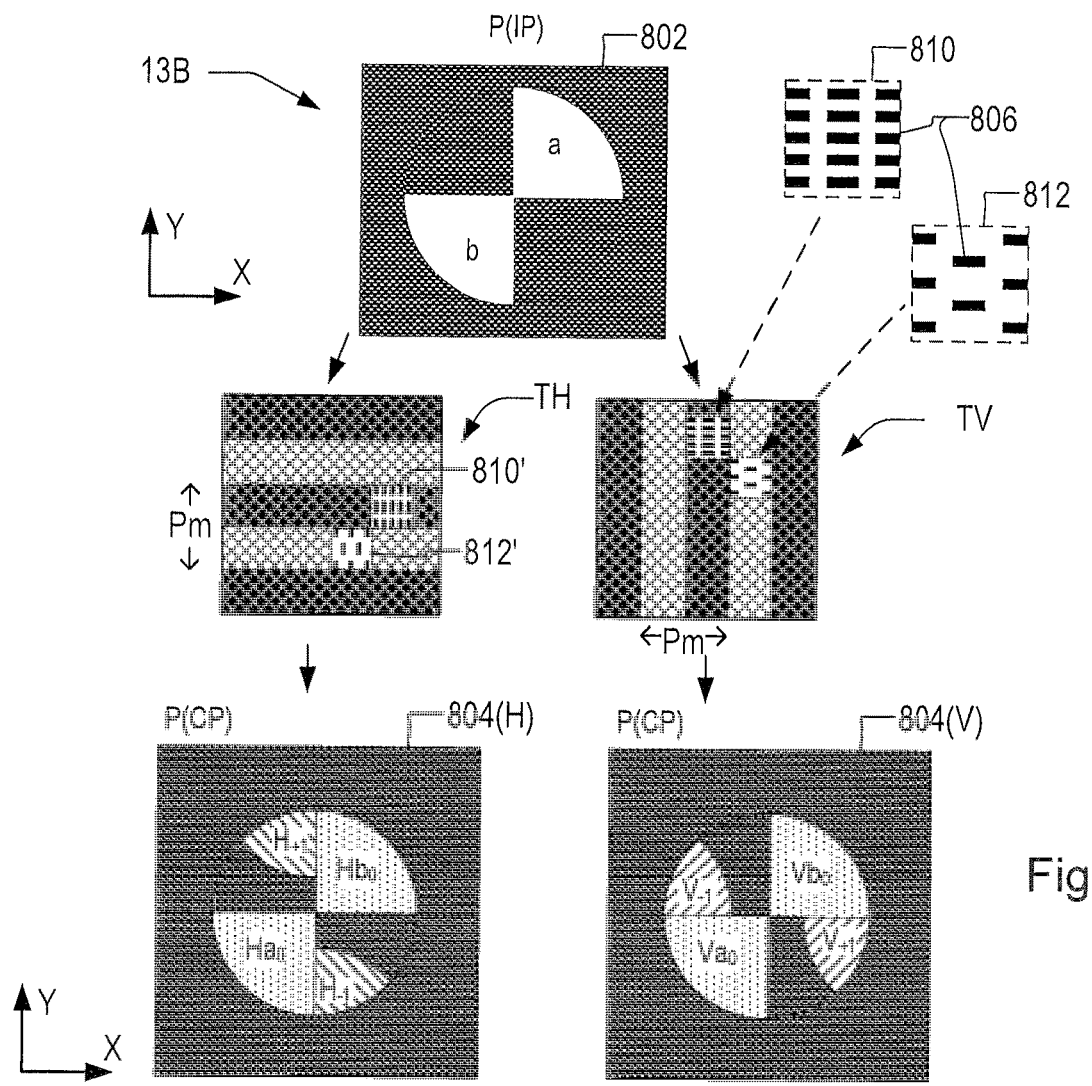
Fig. 8A
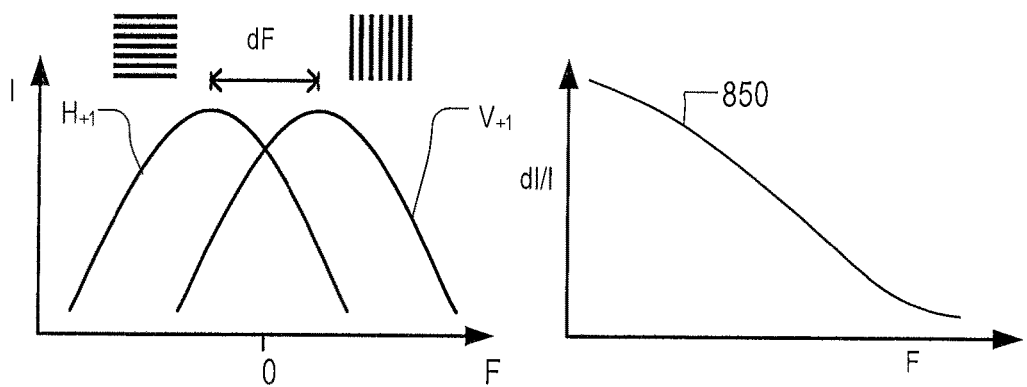
Fig. 8B
Fig. 8C

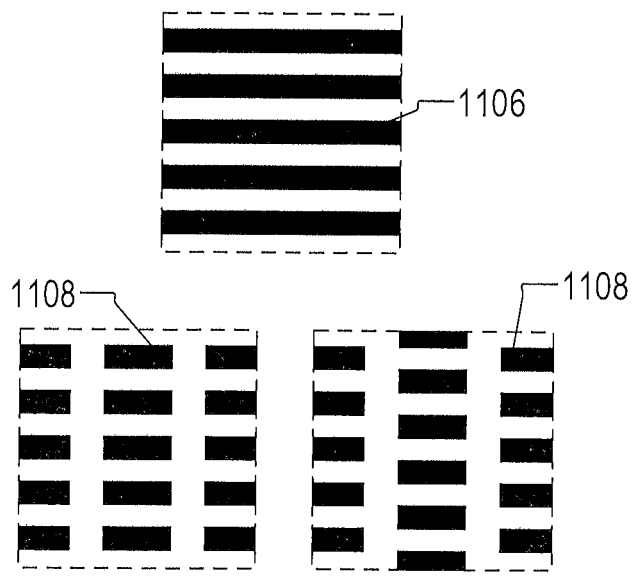
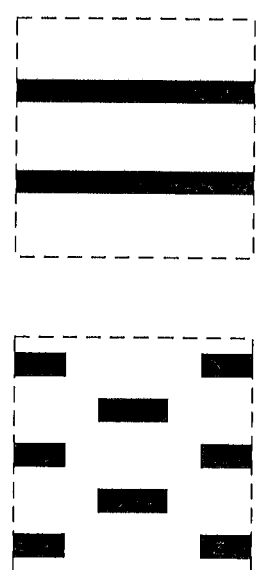
Fig. 9A
Fig. 9B
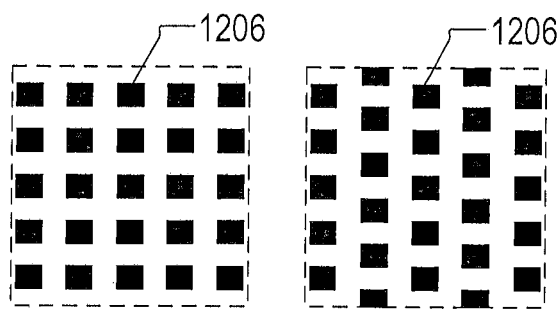
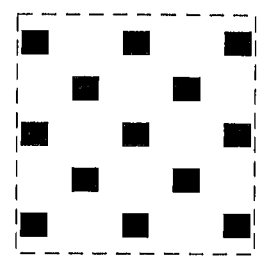
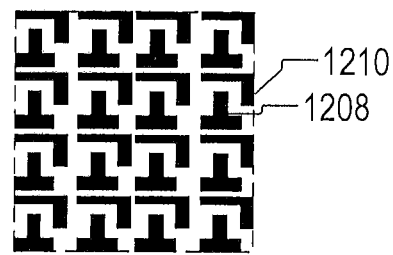
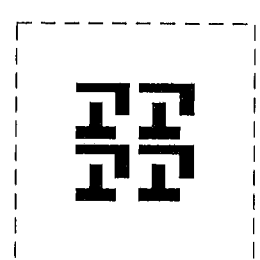
Fig. 10A
Fig. 10B

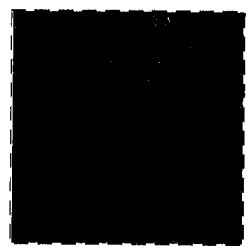
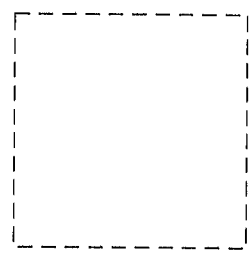
Fig. 11A                    Fig. 11B
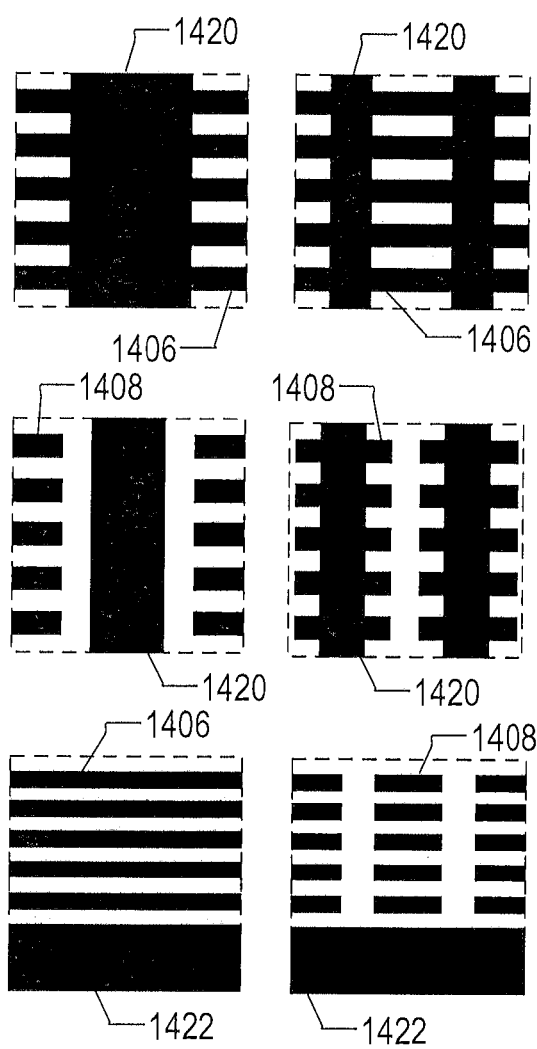
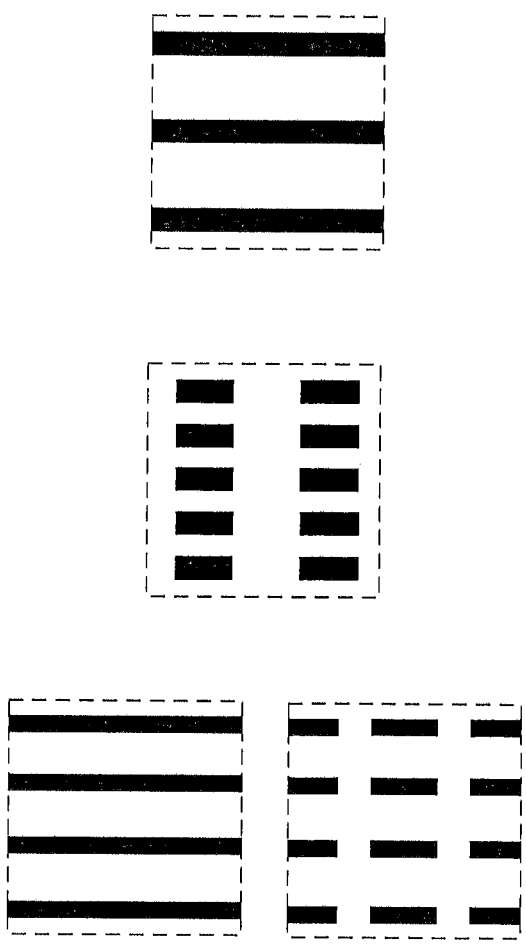
Fig. 12A                    Fig. 12B

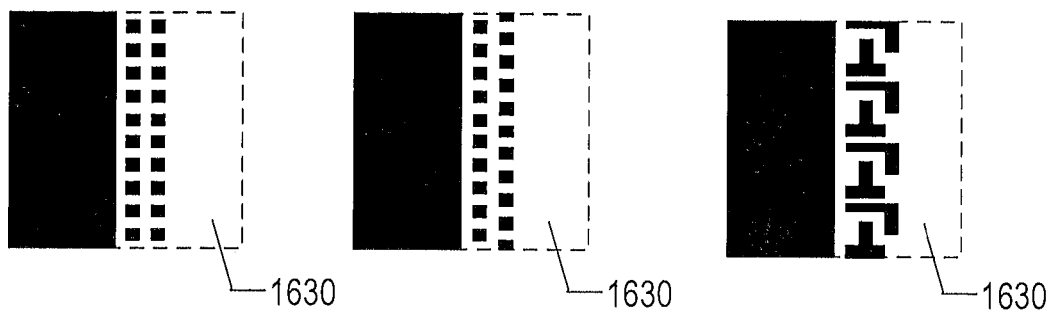
Fig. 14
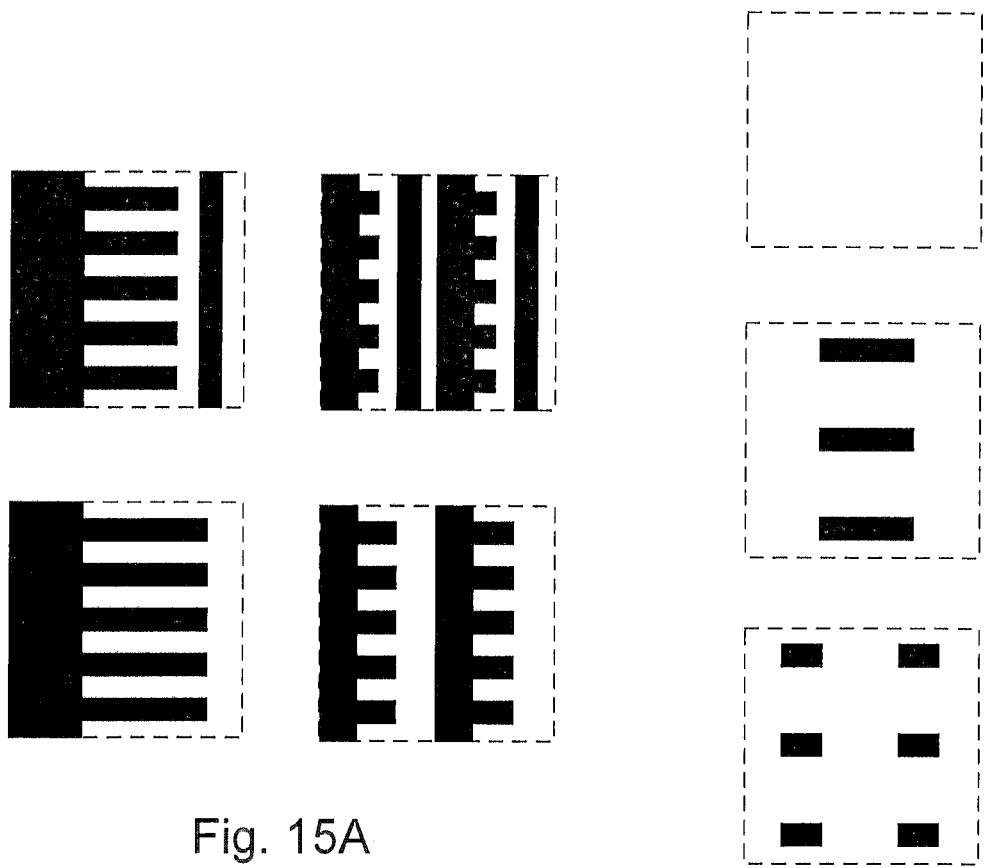
Fig. 15A
Fig. 15B

MEASUREMENT METHOD, INSPECTION APPARATUS, PATTERNING DEVICE, LITHOGRAPHIC SYSTEM AND DEVICE MANUFACTURING METHOD

This application claims the benefit of priority of European patent application no. 17205144, filed Dec. 4, 2017, the benefit of priority of European patent application no. 18165518, filed Apr. 3, 2018, and the benefit of priority of European patent application no. 18175874, filed Jun. 5, 2018. Each of the foregoing applications is incorporated herein in its entirety by reference.

FIELD

The present description relates to methods and apparatuses usable, for example, to perform metrology in the manufacture of devices by lithographic techniques. The present description further relates to target structures and patterning devices for use in such methods. The present description further relates to methods for monitoring a focus parameter in a lithographic process and methods of manufacturing devices.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is frequently desirable to make measurements of the structures created, e.g., for process control and verification. Various tools for making such measurements are known, including scanning electron microscopes, which are often used to measure critical dimension (CD), and specialized tools to measure overlay, the accuracy of alignment between two layers in a device. Various forms of inspection apparatuses (such as scatterometers) have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known inspection apparatuses include angle-resolved scatterometers of the type described in United States patent application publication nos. US 2006-033921 and US 2010-201963, which documents are hereby incorporated by reference in their entirety. The targets used by such scatterometers are relatively large, e.g., 40 μm by 40 μm, gratings and the measurement beam generates a spot that is smaller than the grating (i.e., the grating is under-filled). Angle-resolved scatterometry can be combined with dark field imaging metrology, for example as described in U.S. patent application publication nos. US 2010-0328655 and US 2011-069292, which documents are hereby incorporated by reference in their entirety. Further developments of measurement techniques have been described in U.S. patent application publication nos. US 2011-0027704, US 2011-0043791, US 2011-102753, US 2012-0044470, US 2012-0123581, US 2013-0258310, and US 2013-0271740 and in PCT patent application publication no. WO 2013-178422, which documents are hereby incorporated by reference in their entirety. Dark field imaging enables the use of targets smaller than the illumination spot and targets which may be surrounded by product structures on a substrate. Multiple gratings can be measured in one image, using a composite grating target.

A significant parameter of a lithographic process which should be monitored is focus. There is a desire to integrate an ever-increasing number of electronic components in a device such as an integrated circuit. To realize this, the size of the components should be decreased and therefore the resolution of the projection system should be increased, so that increasingly smaller details, or line widths, can be projected on a target portion of the substrate. As the critical dimension (CD) in lithography shrinks, consistency of focus, both across a substrate and between substrates, becomes more significant. CD is the dimension of a feature or features (such as the gate width of a transistor) for which variations will cause undesirable variation in physical properties of the feature.

SUMMARY

Traditionally, optimal settings of the lithographic apparatus or process were determined by "send-ahead substrates" i.e. substrates that are exposed, developed and measured in advance of a production run. In the send-ahead substrates, test structures were exposed in a so-called focus-energy matrix (FEM) and the best focus and energy settings were determined from examination of those test structures.

Current test structure designs and focus measuring methods may have a number of drawbacks. Many test structures designed for focus metrology use sub-resolution features (features on the patterning device that are too small to be printed in the resist), or grating structures with large pitches. Such structures may contravene design rules of the users of lithographic apparatuses, and therefore be excluded from use on real product patterning devices. Diffraction-based focus measuring techniques can be used, which techniques comprise measuring asymmetry in opposite higher (e.g., first) order radiation scattered by special, focus dependent, target structures, and determining focus from this asymmetry. For lithography involving extreme ultraviolet (EUV) radiation, resist thickness, and therefore the thickness of target structures, is smaller (for example, half as thick). Therefore, focus sensitivity and signal strength may be insufficient to use such asymmetry methods in EUV lithography. In addition, asymmetry based techniques may require careful selection of target geometries to help ensure a desired relationship (e.g., linear) between asymmetry and focus. This selection process can be complex and may require significant effort to find a suitable target geometry. It may even be the case that no suitable target geometry exists.

In U.S. patent application publication no. US 2016-363871, which document is hereby incorporated by reference in its entirety, it has been proposed to use one or more pairs of targets that have been formed with a "best focus offset" dF between the targets of a pair. A focus measurement can then be derived as a function of a diffraction signal measured on the first target and a corresponding diffraction signal measured on the second target. Special sub-resolution features are not required. A particular way to introduce a best focus offset is to print gratings with different orientations, while using a non-zero setting of astigmatism in the projection system. This astigmatism based focus measurement method, known as ABF, can be useful for focus metrology in EUV lithography. ABF can be used in conventional lithography as well. Various improvements and alternatives to the ABF method have been disclosed in European patent application no, EP17187069.4 dated Aug. 21, 2017, which document is hereby incorporated by reference in its entirety.

The disclosure herein discloses, for example, potential improvements to the range of targets and techniques available for focus metrology in lithographic manufacturing processes. The disclosure herein discloses, for example, targets that enable focus measurements to be performed in high volume by scatterometry, while also being potentially compatible with product design rules.

In aspect, there is provided a method of measuring focus performance of a lithographic apparatus, the method comprising:

(a) using the lithographic apparatus to print at least a first focus metrology target on a substrate, the printed focus metrology target including at least a first periodic array of features;

(b) using inspection radiation to obtain one or more diffraction signals from the first periodic array in the printed focus metrology target; and (c) deriving a measurement of focus performance based at least in part on the diffraction signals, wherein the first periodic array comprises a repeating arrangement of first zones interleaved with second zones in at least a first direction of periodicity, a feature density being different in the first zones and the second zones, wherein each of the first zones includes a repeating arrangement of first features, a minimum dimension of each first feature being close to but not less than a resolution limit of the printing step.

The minimum dimension of each first feature being close to but not less than a resolution limit of the printing step enables compliance with a common example of a design rule. The methods (a) to (c) can be adapted to perform astigmatism based focus metrology, or alternative methods described in the prior application and patent application publications. The design of the focus metrology target can be adapted according to the chosen method. The design of the focus metrology target can be optimized for different process environments, including additional design rules.

In an aspect, there is provided a patterning device for use in a lithographic apparatus, the patterning device comprising contrasting portions that when printed by the lithographic apparatus define features of one or more device patterns and one or more metrology patterns, the one or more metrology patterns including at least a first focus metrology target, the first focus metrology target including at least a first periodic array of features, wherein the first periodic array comprises a repeating arrangement of first zones interleaved with second zones in at least a first direction of periodicity, a feature density being different in the first zones and the second zones, wherein each of the first zones includes a repeating arrangement of first features, a minimum dimension of each first feature being close to but not less than a resolution limit of the printing by the lithographic apparatus.

In an aspect, there is provided a method of inspecting a target structure, the method comprising:

(a) using an illumination system to illuminate the target structure with inspection radiation;

(b) using a detection system to capture diffraction signals comprising selected portions of radiation diffracted by the target structure in two or more diffraction directions; and (c) processing information derived from the diffraction signals to determine a property of the target structure, wherein the illumination system provides a segmented illumination profile having illuminated regions and dark regions, each illuminated region being symmetrically opposite a dark region, when reflected in any of the diffraction directions, a radial extent of the illuminated regions being greater in the diffraction directions than it is in directions intermediate between the diffraction directions.

By reducing the radial extent of the illuminated regions in the intermediate directions, the risk of overlap between different diffraction signals is reduced. This aspect therefore allows measurement of diffraction signals in two directions simultaneously, over a wider range of operating conditions than before. This method can be used in focus metrology methods such as ones described herein. This method can be used in a variety of other inspection purposes.

Further aspects, features and advantages of the disclosure, as well as the structure and operation of various embodiments of the disclosure, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5A and FIG. 5B illustrate schematically an inspection apparatus adapted to perform angle-resolved scatterometry and dark-field imaging inspection methods;

FIG. 6 illustrates target forming elements on a patterning device suitable for forming a grating on a substrate having focus dependent asymmetry, according to a diffraction-based focus (DBF) measurement technique;

FIG. 7B shows a plot of the difference between measured values for a target parameter from a first target and a second target (y-axis) against focus (x-axis), wherein FIGS. 7A and 7B illustrates the ABF focus measurement method described in U.S. patent application publication no. US 2016-363871 mentioned above;

FIG. 8A illustrates a process of obtaining diffraction signals from a pair of targets using the scatterometer of FIG. 3 or FIG. 5, as part of an embodiment of the disclosure;

FIG. 8B shows a plot of a diffraction signal that might be obtained for the pair of targets with varying focus of FIG. 8A;

FIG. 8C shows a difference metric obtained from the diffraction signals of FIG. 8B for use in calculating a focus measurement;

FIG. 9A illustrates examples of cell patterns for use in dense regions of target structures;

FIG. 9B illustrates examples of cell patterns for use in sparse regions of target structures;

FIG. 10A illustrates further examples of cell patterns for use in dense regions of target structures;

FIG. 10B illustrates further examples of cell patterns for use in sparse regions of target structures;

FIG. 11A illustrates extreme cell patterns for use in dense regions of target structures;

FIG. 11B illustrates extreme cell patterns for use in sparse regions of target structures;

FIG. 12A illustrates further examples of cell patterns for use in dense regions of target structures;

FIG. 12B illustrates further examples of cell patterns for use in sparse regions of target structures;

FIG. 14 illustrates further examples of cell patterns for use in dense regions of target structures;

FIG. 15A illustrates further examples of cell patterns for use in dense regions of target structures;

FIG. 15B illustrates further examples of cell patterns for use in sparse regions of target structures;

DETAILED DESCRIPTION

Before describing embodiments of the disclosure in detail, it is instructive to present an example environment in which embodiments of the present disclosure may be implemented.

Figure 1:
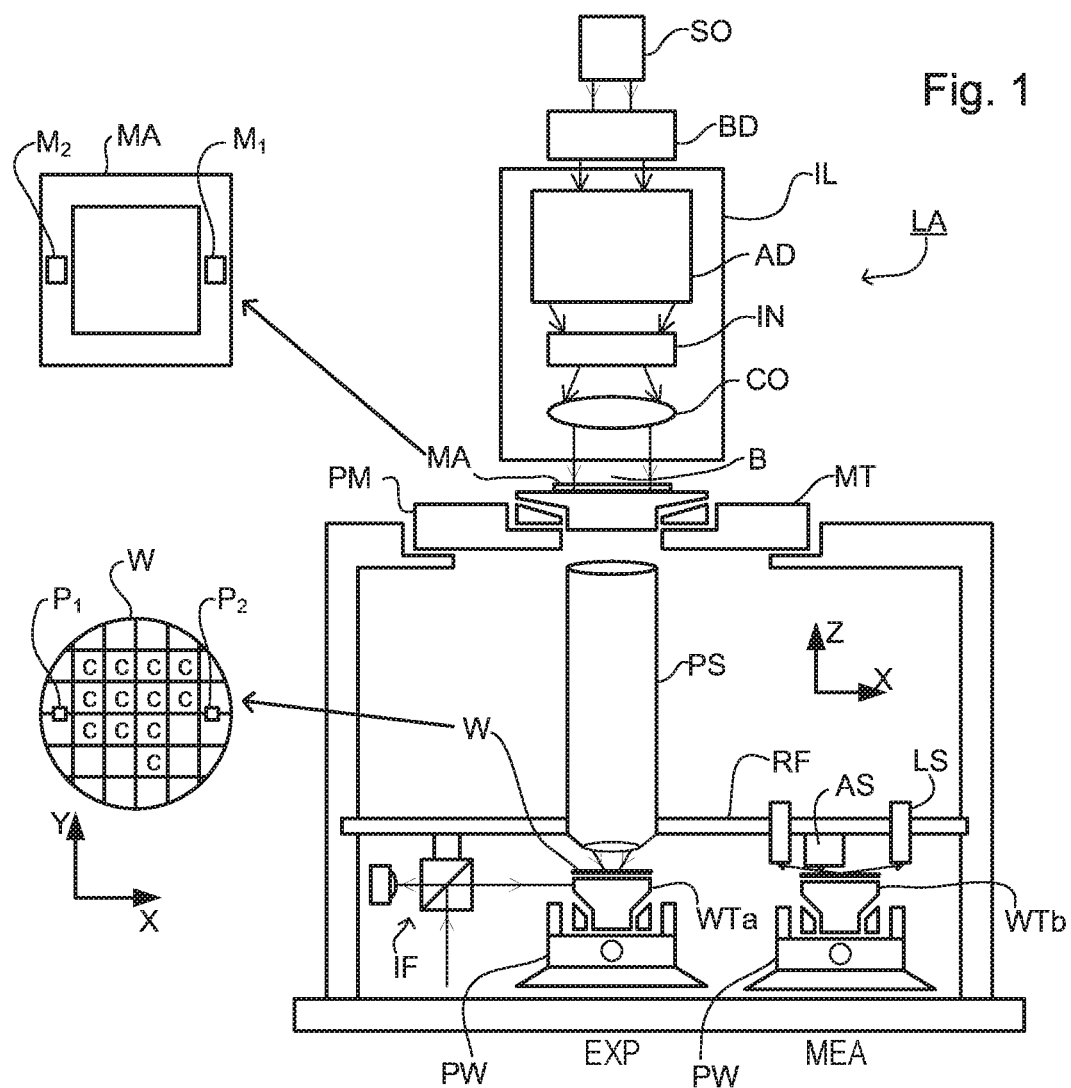
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables Wta, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
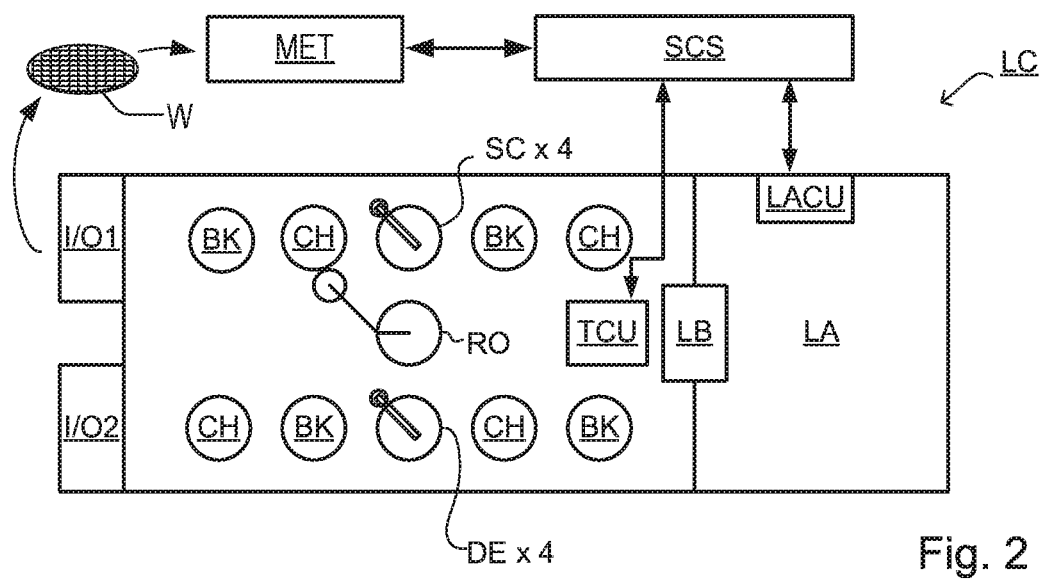
FIG. 2 depicts a lithographic cell or cluster in which an inspection apparatus according to the present disclosure may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include one or more spin coaters SC to deposit resist layers, one or more developers DE to develop exposed resist, one or more chill plates CH and/or one or more bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure one or more properties such as overlay errors between subsequent layers, line thicknesses, critical dimensions (CD), etc. Accordingly, a manufacturing facility in which a lithocell LC is located also typically includes a metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the one or more properties of the substrates, and in particular, how the values of the one or more properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatuses have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
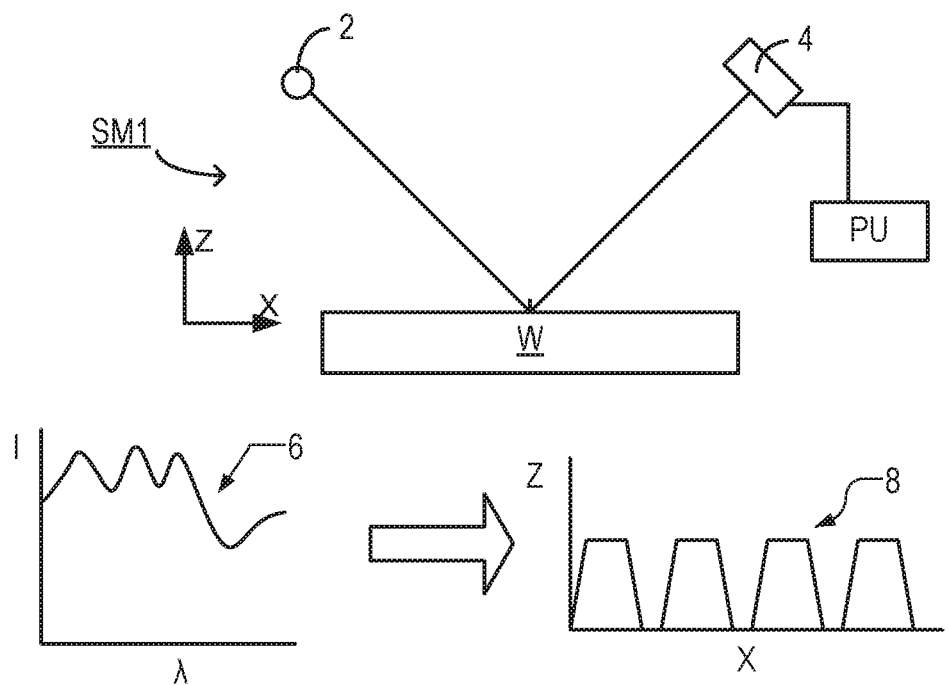
FIG. 3 illustrates the principles of operation of a spectroscopic scatterometer as a first example of an inspection apparatus.

FIG. 3 highly schematically depicts an example of a spectroscopic scatterometer which may be used as an inspection apparatus in a metrology system of the type described above. It comprises a broadband (white light) radiation projector 2 which projects radiation onto a substrate W. The radiation redirected by the substrate W is passed to a spectrometer 4, which measures a spectrum 6 (intensity as a function of wavelength) of the specular radiation. From this data, the structure or profile 8 giving rise to the detected spectrum may be reconstructed by calculation within processing unit PU. The reconstruction can be performed for example by Rigorous Coupled Wave Analysis and non-linear regression, or comparison with a library of pre-measured spectra or pre-computed simulated spectra. In general, for the reconstruction the general form of the structure is known, and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
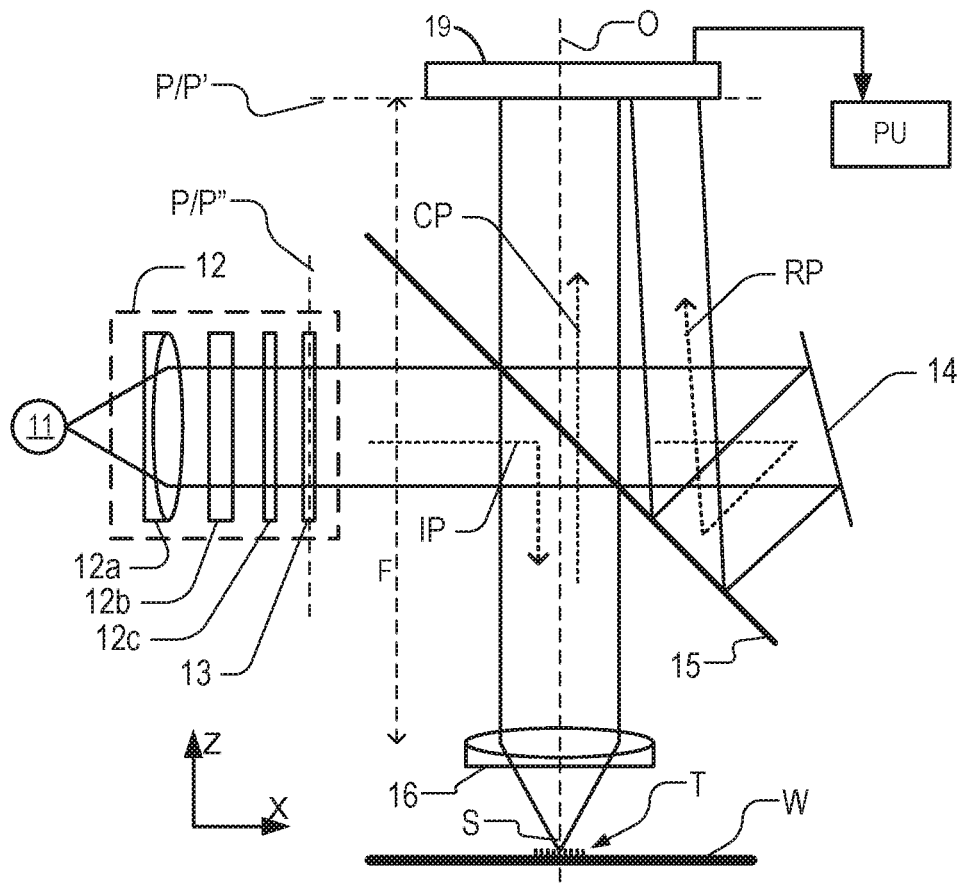
FIG. 4 illustrates in schematic form an angle-resolved scatterometer as another example of an inspection apparatus.

FIG. 4 schematically shows the basic elements of an angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16 has a high numerical aperture (NA), desirably at least 0.9 and more desirably at least 0.95. Immersion fluid can be used to obtain numerical apertures over 1 if desired.

As in the lithographic apparatus LA, one or more substrate tables may be provided to hold the substrate W during measurement operations. The one or more substrate tables may be similar or identical in form to one or more of substrate tables WTa, WTb of FIG. 1. (In an example where the inspection apparatus is integrated with the lithographic apparatus, they may even be the same substrate table(s).) Coarse and fine positioners may be configured to accurately position the substrate in relation to a measurement optical system. Various sensors and actuators are provided for example to acquire the position of a target of interest, and to bring it into position under the lens 16. Typically, many measurements will be made on targets at different locations across substrate W. The substrate support can be moved in X and Y directions to acquire different targets, and in the Z direction to provide the target on the substrate in a desired focus of the optical system. It is convenient to think and describe operations as if the objective lens and optical system being brought to different locations on the substrate, when in practice the optical system remains substantially stationary and only the substrate moves. Provided the relative position of the substrate and the optical system is correct, it does not matter in principle whether one or both of those is moving in the real world.

When the radiation beam is incident on the surface 15 part of it is transmitted through and follows a reference path RP towards a reference mirror 14.

Radiation redirected by the substrate, including radiation diffracted by any metrology target T, is collected by lens 16 and follows a collection path CP in which it passes through partially reflecting surface 15 into a detector 19. The detector may be located in the back-projected pupil plane P, which is at the focal length F of the lens 16. In practice, the pupil plane itself may be inaccessible, and may instead be re-imaged with auxiliary optics (not shown) onto the detector located in a so-called conjugate pupil plane P'. The detector is desirably a two-dimensional detector so that a two-dimensional angular scatter spectrum or diffraction spectrum of a substrate target T can be measured. In the pupil plane or conjugate pupil plane, the radial position of radiation defines the angle of incidence/departure of the radiation in the plane of focused spot S, and the angular position around an optical axis O defines an azimuth angle of the radiation. The detector 19 may be, for example, an array of CCD or CMOS sensors, and may use an integration time of, for example, 40 milliseconds per frame.

Radiation in reference path RP is projected onto a different part of the same detector 19 or alternatively on to a different detector (not shown). A reference beam is often used for example to measure the intensity of the incident radiation, to allow normalization of the intensity values measured in the scatter spectrum.

The various components of illumination system 12 can be adjustable to implement different metrology 'recipes' within the same apparatus. Color filter 12b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles. Aperture device 13 is located in a plane P'' conjugate with pupil plane P of objective lens 16 and the plane of the detector 19. In this way, an illumination profile defined by the aperture device defines the angular distribution of radiation incident on substrate radiation passing through different locations on aperture device 13.

The detector 19 may measure the intensity of scattered radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS. Illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

In addition to measurement of parameters by reconstruction, angle resolved scatterometry is useful in the measurement of asymmetry of features in product and/or resist patterns. A particular application of asymmetry measurement is for the measurement of a focus parameter (for example, the focus setting during exposure of the target) from targets which print with a focus dependent asymmetry. The concepts of asymmetry measurement using the instrument of FIG. 3 or FIG. 4 are described for example in U.S. patent application publication no. US 2006-066855 referenced above. Simply stated, while the positions of the diffraction orders in the diffraction spectrum of the target are determined only by the periodicity of the target, asymmetry of intensity levels in the diffraction spectrum is indicative of asymmetry in the individual features which make up the target. In the instrument of FIG. 4, where detector 19 may be an image sensor, such asymmetry in the diffraction orders appears directly as asymmetry in the pupil image recorded by detector 19. This asymmetry can be measured by digital image processing in unit PU, and from this, focus can be determined.

FIG. 5A shows in more detail an inspection apparatus implementing angle-resolved scatterometry by the same principles as the apparatus of FIG. 4, with additional adaptations for performing so-called dark field imaging. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating T and diffracted rays are illustrated in more detail in FIG. 5B.

The same reference numbers are used for components described already in the FIG. 4 apparatus. The illumination path is labeled IP as before. The reference path RP is omitted, for clarity. Compared with that apparatus, a beam splitter 17 divides the collection path into two branches. In a first measurement branch, detector 19 records a scatter spectrum or diffraction spectrum of the target exactly as described above. This detector 19 may be referred to as the pupil image detector.

In the second measurement branch, imaging optical system 22 forms an image of the target on the substrate W on sensor 23 (e.g. a CCD or CMOS sensor). An aperture stop 21 is provided in a plane that is in the collection path in a plane conjugate to the pupil-plane (it may also be called a pupil stop). Aperture stop 21 can take different forms, just as the illumination aperture can take different forms. Typically, aperture stop 21 functions to block the zeroth order diffracted beam so that the image of the target formed on sensor 23 is formed only from the first order beam(s). This is the so-called dark field image, equivalent to dark field microscopy. The images captured by sensors 19 and 23 are output to image processor and controller PU, the function of which will depend on the particular type of measurements being performed.

In the illumination path in this example, additional optics are shown such that a field stop 13' can be placed in a plane conjugate with the plane of the target and the image sensor 23. This plane may be referred to as a field plane, or conjugate image plane, and has the property that each spatial position across the field plane corresponds to a position across the target. This field stop may be used for example to shape the illumination spot for a particular purpose, or simply to avoid illuminating features that are within the field of view of the apparatus but not part of the target of interest. The following drawings and discussion refer, by way of example, to techniques for implementation of the function of aperture device 13, but the present disclosure also encompasses use of the same techniques to implement the function of field stop 13'.

As shown in more detail in FIG. 5B, target grating T is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

Different modes of illumination are possible by using different apertures. Apertures 13N ('north') and 13S ('south') each provide off-axis illumination from a specific narrow range of angles only. Returning to FIG. 5A, this is illustrated by designating diametrically opposite portions of the annular aperture as north (N) and south (S). The +1 diffracted rays from the north portion of the cone of illumination, which are labeled +1(13N), enter the objective lens 16, and so do the −1 diffracted rays from the south portion of the cone (labeled −1(13S)). As described in the prior applications mentioned in the introduction, using the dark-field imaging sensor 23 while switching between apertures 13N, 13S of this type is one way of obtaining asymmetry measurements from multiple small targets. Aperture stop 21a can be used to block the zeroth order radiation when using off-axis illumination.

While off-axis illumination is shown, on-axis illumination of the targets may instead be used, while an aperture stop with an off-axis aperture is used to pass substantially only one first order of diffracted radiation to the sensor. In one example, prisms 21b are used in place of aperture stop 21 which have the effect of diverting the +1 and −1 orders to different locations on sensor 23 so that they can be detected and compared without making two images. This technique is disclosed in U.S. patent application publication no. US 2011-102753, the entire contents of which is hereby incorporated by reference. 2nd, 3rd and higher order beams (not shown in FIG. 5) can be used in measurements, instead of or in addition to the first order beams.

An alternative segmented aperture design shown at 13B can be used to capture multiple diffraction orders at the same time. The principles of using such a segmented aperture are disclosed in U.S. patent application publication no. US 2010-201963, the entire contents of which is hereby incorporated by reference.

When monitoring a lithographic process, it is desirable to monitor focus of the lithography beam on the substrate. One method of determining the focus setting from a printed structure is by measuring the critical dimension (CD) of the printed structure. CD is a measure of the smallest feature (e.g., line width of an element). The printed structure may be a target, such as a line-space grating, formed specifically for focus monitoring. It is known that CD usually displays $2^{nd}$ order response to focus, forming what is known as a "Bossung curve" on a plot of CD (y-axis) against focus (x-axis). A Bossung curve is a substantially symmetrical curve which is substantially symmetrical around a peak representing the best focus. The Bossung curve may be substantially parabolic in shape. There are several drawbacks to this approach. One drawback is that the method shows low sensitivity near best focus (due to the parabolic shape of the curve). Another drawback is that the method is insensitive to the sign of any defocus (as the curve is largely symmetrical around best focus). Also, this method is sensitive, among other things, to dose and process variation (crosstalk).

To address these issues, diffraction based focus (DBF) was devised. Diffraction based focus may use target forming features of a patterning device to print targets having a degree of asymmetry which is dependent on the focus setting during printing. This degree of asymmetry can then be measured using a scatterometry based inspection method, for example by measuring the intensity asymmetry between the intensities of $+1^{st}$ and $-1^{st}$ order radiation diffracted from the target, to obtain a measure of the focus setting.

FIG. 6 illustrates a DBF target forming design 615 configured for diffraction based focus measurements. It comprises plural DBF structures 620, each of which comprises high resolution substructures 625. The high-resolution substructures 625 on top of a base pitch create an asymmetric resist profile for each DBF structure 620, with the degree of asymmetry being dependent upon focus. Consequently, a metrology tool can measure the degree of asymmetry from a target formed using DBF target forming design 615 and translate this into the lithographic apparatus focus at the time of printing the DBF target.

While the DBF target forming design 615 enables diffraction based focus measurements, it is not suitable for use in all situations. EUV resist film thicknesses are significantly lower than those used in immersion lithography, which makes it difficult to extract accurate asymmetry information from the asymmetric profile of the structures forming part of a target. In addition, such structures may not comply with the strict design constraints applicable to certain product structures. During the device making process, all features printed by the patterning device should print properly and stand up to subsequent processing steps. Device manufacturers use design rules as a means to restrict the feature designs to help ensure the printed features conform to their process requirements. An example of such a design rule relates to the allowable size of structures or pitches. For example, one design rule may forbid features having dimensions below the resolution limit of the lithographic printing step. Another type of design rule may relate to pattern density, which may restrict the density of a resulting resist pattern to be within a particular range. One such design rule may prohibit solid features greater than a certain dimension. Another such design rule may prohibit spaces between features, greater than a certain dimension.

It is therefore proposed to monitor focus using targets that do not rely on non-printing features that may break design rules. In United States patent application publication US 2016-363871 mentioned above, it was proposed to use one or more pairs of targets that have been formed with a "best focus offset" dF between the two targets. As before, the focus response with a measurement value for a target parameter (for example CD or other measurements as will be described below) takes the form of a Bossung curve for each of the first and second targets. However, the best focus offset means that the two Bossung curves are offset from one another. A focus measurement can then be derived as a function of a target property as measured on the first target and the target property as measured on the second target. A specific example of how focus may be derived is described below, with reference to FIG. 7. However, the skilled person will realize that there are many alternative methods that allow focus to be extracted from the measured values obtained from the first and second targets. While the description below specifically discusses using a difference of the two measurement values (whether they be intensity values or otherwise), other mathematical operations and methods may be used to extract a focus value. For example, it is possible to divide one of the measurement values (from one of the first and second targets) into the other measurement value (from the other of the first and second targets).

Figure 7A:
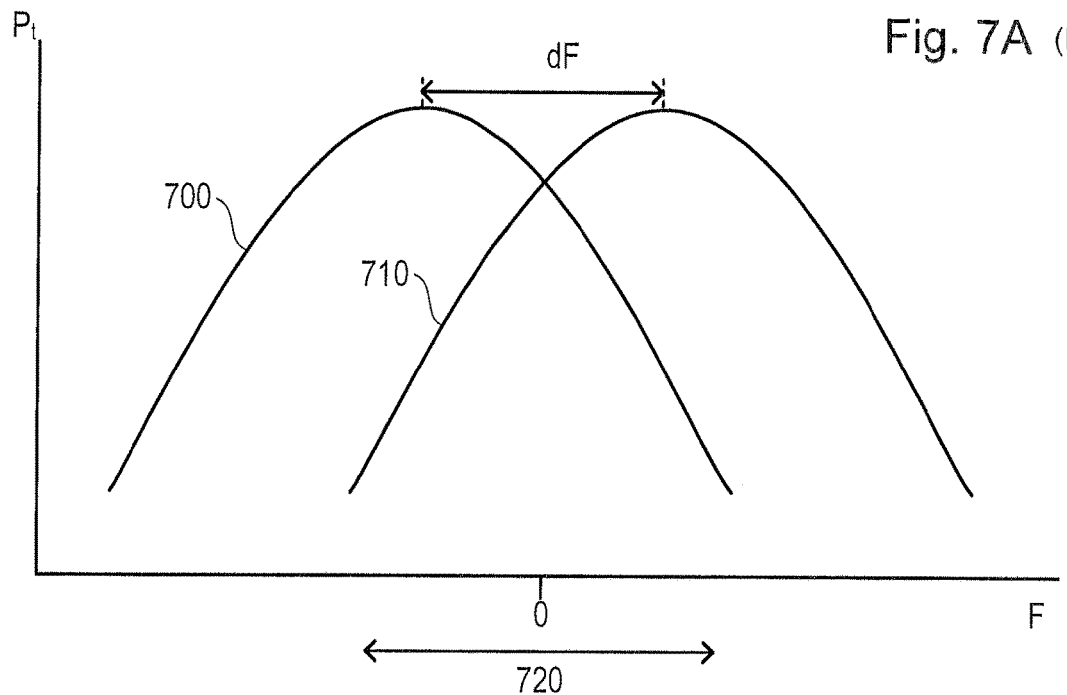
FIG. 7A shows a plot of a measured value for a target property (y-axis) against focus, for two targets having a relative best focus offset.

FIG. 7A shows a plot of a target property $P_t$ against focus f for both the first target and second target. The target parameter could be any property of the target that can be obtained by measurement. A first Bossung curve 700 corresponds to the first target and a second Bossung curve 710 corresponds to the second target. Also shown is the best focus offset dF (the focus offset between the two peaks of Bossung curves 700, 710). The target property $P_{t1}$ for the first target and the target property $P_{t2}$ for the second target can be modeled by Bossung curves having the following equations:

$$P_{t1} = a(F - \tfrac{1}{2}dF)^2$$

$$P_{t2} = a(F + \tfrac{1}{2}dF)^2$$

Figure 7B:
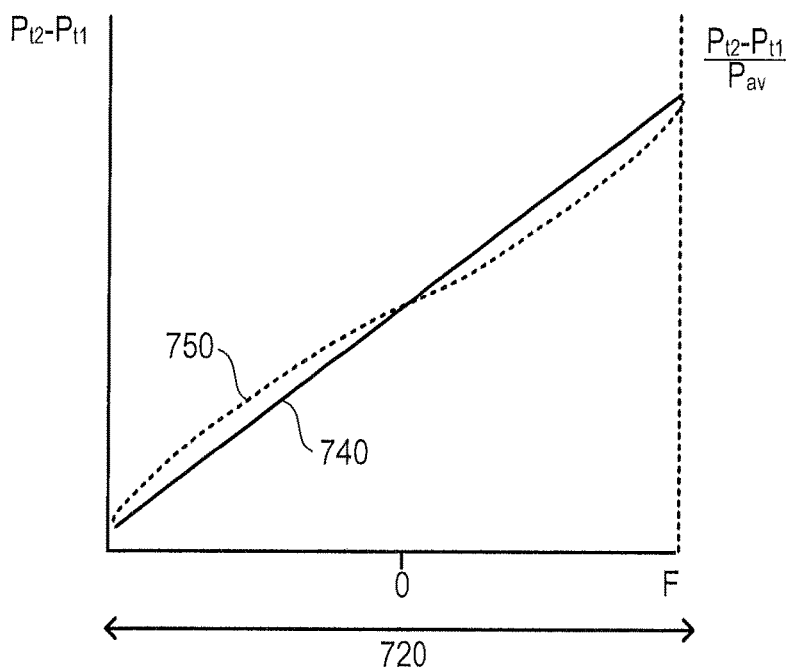

In FIG. 7B, curve 740 is a plot of the difference $P_{t2}-P_{t1}$ between the target property for the first target and the target property for the second target, as it varies against focus. Where the Bossung curves of the targets overlap is the focus range 720, through which a difference of the target property for the first target and the target property for the second target has a monotonic, approximately linear relationship with focus. As can be seen, the relationship 740 is linear. The $P_{t2}-P_{t1}$ metric may be sensitive to crosstalk, e.g. by dose and/or process. A more robust metric may be $(P_{t2}-P_{t1})/P_{tAV}$, where $P_{tAV}$, is the average of $P_{t2}$ and $P_{t1}$. The relationship 750 (dotted) of $(P_{t2}-P_{t1})/P_{tAV}$ with focus is also shown in FIG. 7B. This relationship is also monotonic and sufficiently linear, while being more robust against crosstalk.

In the specific example illustrated, the slope of relationship 740 or relationship 750 can be described by $2*dF*a$ where dF is the best focus offset and a is the Bossung curvature. Accordingly, focus F can be obtained from the following equation:

$$F = \frac{P_{t2} - P_{t1}}{2 \cdot dF \cdot a \cdot P_{tAV}}$$

where $P_{tAV}$ in the denominator is optional.

In some of the embodiments of interest for the present disclosure, the best focus offset is introduced between two targets by printing those targets using a deliberate aberration of the lithographic apparatus. A deliberate non-zero setting of an aberration parameter can be applied, which combines with differences in the design between the targets of the pair to induce the best focus offset. As described in U.S. patent application publication no. US 2016-363871, the best focus offset between the first target and second target can be introduced in one implementation by printing the pair of targets using a deliberate, controlled astigmatism as an example of such an aberration parameter. The astigmatism in normal operation would be controlled to be as close as possible to zero. However, a deliberate non-zero astigmatism may be introduced to the projection system via one or more manipulators included within the projection system. The projection optical elements in many lithographic apparatuses enable a sufficiently large astigmatism offset to create a best focus offset, without introducing other, unwanted aberrations. This astigmatism will introduce a difference in focal distances for features in different orientations. In an embodiment, the astigmatism may introduce a best focus offset between horizontal and vertical features. To exploit this, the first and second targets may comprise respectively a horizontal grating and a vertical grating (or vice versa). It will be understood that the terms "horizontal" and "vertical" in this context refer only to features oriented orthogonally to one another in the plane of the substrate. No reference to any particular orientation with respect to any external reference frame or to gravity is implied.

Referring again to FIG. 7, the curve 700 may represent a property $P_t$ of a horizontal grating while the curve 710 represents the same property of the vertical grating. The relative best focus offset dF between the two gratings depends then on the amount of astigmatism. To increase focus sensitivity, it is possible to increase the best focus offset by increasing the astigmatism setting, thereby increasing the slope of relationship 740 or relationship 750.

In the above discussion, it should be appreciated that any target property $P_t$ can be used provided it has a Bossung curve response with focus. The method of U.S. patent application publication no. US 2016-363871 uses intensity signals obtained from diffraction orders of radiation scattered by the first target and second target to determine focus. In particular, it is proposed to use intensity values of a single diffraction order from each of the first and second targets to determine focus. The proposed method may use intensity values from corresponding diffraction orders of the first and second targets. For example, the intensity values could be that of the $+1^{st}$ (or $-1^{st}$) diffraction orders from the first and second targets. Alternatively, or in combination, the intensity values could be that of the zeroth diffraction orders from the first and second targets.

In a specific example of such a method, it is proposed to use the difference dI in the measured intensity of a diffraction order of radiation scattered by the first target and the measured intensity of the corresponding diffraction order of radiation scattered by the second target. This difference is hereafter referred to as the "dI metric", and is an example of the more generic different $P_{t2}-P_{t1}$ referred to above. However, the dI metric may be any metric that has the effect of comparing diffraction intensities from the first and second targets (e.g., by dividing one of the intensity values into the other, rather than subtracting). This is different from known DBF methods, where opposite diffraction orders from the same target are compared to obtain measurements of asymmetry of that target.

Using a dI metric in this way provides focus measurements with good signal strength and signal-to noise response, even when the targets comprise shallow gratings (e.g., for use in EUV lithography).

As mentioned above, the dI metric may comprise the difference of the zeroth orders of radiation scattered by the first and second targets. In this way, targets with smaller pitches can be used. Consequently, target pitch for the first and second targets can be chosen to agree with any design rules. Also, smaller target pitches mean that the overall target size can be reduced. Multiple pitches are also possible.

Where first order diffracted radiation is used, and since only a single first order is required per measurement, the pitch to use first order radiation is reduced to $\Lambda/2$ (where $\Lambda$ is the detection wavelength) in the limit of numerical aperture NA=1. This will mean that the linear target dimension can be reduced by a factor of 2 and the area used by the target by a factor of 4. Particularly in an embodiment where the inspection apparatus allows both + and − diffraction orders to be captured at the same time, calculations can combine measurements using both orders, for additional confidence.

Metrology Target with Different Density Zones

FIG. 8A illustrates such an embodiment, in which a scatterometer of the type illustrated in FIG. 5 is used to capture positive and negative diffraction orders from horizontal grating TH and vertical grating TV, each having a period Pm which in this example are the same (although the value of period Pm for horizontal grating TH need not be the same as the value of period Pm for vertical grating TV). These gratings may for example be targets that have been printed on a substrate using an astigmatism setting that induces a relative best focus offset dF between them. In accordance with the principles of the present disclosure mentioned above, the targets have a particular design that will be described further below. The distribution of inspection illumination in a pupil plane of the illumination path IP (referred to for short as the illumination profile) is illustrated at 802. A segmented aperture device 13B is used in place of the unipolar apertures 13S and 13N shown in FIG. 5. The principles of using such a segmented aperture are disclosed in U.S. patent application publication no. US 2010-201963, and they will be described only briefly here. As is seen, this segmented illumination profile has two bright segments labeled a and b, that are 180-degree symmetrical to one another. In the X and Y directions from each bright segment the distribution is dark. These directions X and Y correspond to the directions of periodicity of the vertical grating TV and the horizontal grating TH, respectively.

When the segmented illumination profile 802 is used to form a spot of inspection radiation on the horizontal grating TH, the distribution of radiation in the pupil plane of the collection path CP becomes as shown at 804(H). The bright regions $Ha_0$ and $Hb_0$ represent zero order diffraction signals from the target, while regions $H_{+1}$ and $H_{-1}$ represent +1 and −1 order diffraction signals which have been diffracted in the Y direction which is the direction of periodicity of the horizontal grating TH. When the same segmented illumination profile 802 is used to form a spot of inspection radiation on the vertical grating TV, the distribution of radiation in the pupil plane of the collection path CP becomes as shown at 804(V). The bright regions $Va_0$ and $Vb_0$ represent zero order diffraction signals from the target, while regions $V_{+1}$ and $V_{-1}$ represent +1 and −1 order diffraction signals which have been diffracted in the X direction, which is the direction of periodicity of the vertical grating TV.

The gratings TH and TV each comprise a periodic array of features. In accordance with an aspect of the present disclosure, each periodic array of features comprises a repeating arrangement of zones having a relatively high density of features ("dense zones", indicated by darker hatching) interleaved with zones having a relatively low density of features ("sparse zones", indicated by lighter hatching). The "first zones" may be dense zones while the sparse zones may be the "second zones". Within each of the dense zones there is a repeating arrangement of first features 806, a minimum dimension of each first feature being close to but not less than a resolution limit of the printing step. As illustrated in the inset details in FIG. 8A, a repeating arrangement of first features in the dense zones is defined by a cell pattern such as the example illustrated at 810. Similarly, in this example a repeating arrangement of first features in the sparse zones is defined by a cell pattern such as the example illustrated at 812. The repeating arrangement of different zones, together with the features therein, thus defines a target structure which is periodic in at least one direction.

As illustrated, the form of the "horizontal" grating TH is similar to that of the "vertical" grating TV. For measurement of focus using the astigmatism based method (ABF), the horizontal grating is a rotated version of the vertical grating. Thus, the cell patterns 810' and 812' within the horizontal grating are rotated versions of the cell patterns 810 and 812 within the vertical grating, so that the two gratings are affected differently under a given astigmatism setting, and exhibit a best focus offset as a result. The direction in which the first features 806 have the minimum dimension can be the same as the direction of periodicity in the arrangement of zones (grating), or different to it. In the illustrated example, the minimum dimension of the chopped line features 806 in each cell pattern is transverse to the direction of periodicity of the grating as a whole. In other examples, those directions might be aligned to be the same. This is a matter for design choice and experiment, to suit each case. For non-astigmatism based methods, the orientation of the narrow features may not need to be rotated.

In this first illustrated example, the first features 806, individually, are identical between the dense zone cell pattern 810 and the sparse zone cell pattern 812, only fewer in number. As will be seen from further examples, below, the first features need not be the same in the zones of different densities. Furthermore, one or other of the zones of different densities could be entirely without first features.

In this first illustrated example, the widths of the dense zones and sparse zones are equal, and the widths/heights of the cell patterns are equal too. The widths of the dense zones and sparse zones need not be equal, as they are shown.

FIG. 8B illustrates the Bossung curves underlying the response of a particular diffraction signal, in this case the +1 order, for the pair of targets TH and TV, under a particular astigmatism setting. FIG. 8C illustrates the dI metric, more specifically the normalized dl metric or dI/I, that results from the difference between the two Bossung curves over a certain focus measurement range. This dI metric curve 850 corresponds to the curve 750 of FIG. 7. The slope of the curve 850 is downward instead of upward, but this is insignificant as long as it is monotonic. The sign of the best focus offset dF, and consequently the direction of the slope of the curve 750/850 depends somewhat arbitrarily on the selection of diffraction orders, the sign of the astigmatism setting, and the order which the subtraction or division is performed to obtain the dI metric.

Before using the method of FIGS. 7 and 8 to measure focus in a given situation, a calibration substrate or substrates are exposed in which numerous identical target patterns are printed with different, known values of focus error and dose error. This type of substrate is known as a FEM (focus-exposure matrix) substrate, described for example in U.S. Pat. No. 5,856,052, the entire contents of which is incorporated herein in its entirety. Plotting the dl metric obtained by measuring pairs of targets that have been printed with this range of known focus errors yields the curve 850, which is then stored as a calibration curve for future focus metrology on substrates that are not FEM substrates but are printed with nominally best focus. The FEM substrates can be exposed with randomized focus and dose variations, which help to remove systematic errors from the calibration. Any desired scheme can be used. The following examples assume a "Full Field Random" FEM (FFRFEM) scheme, where the full patterning device image is exposed completely in a field. Alternatively, a "Small Field Random" FEM can be used, where the patterning device image is partially exposed in a field.

Depending on the method and target design, a given focus metrology method may be applicable on product substrates, or only on monitor substrates that are processed exclusively for performance measurement and advanced process control. A focus metrology technique may additionally be applicable on "send-ahead" substrates, which are product substrates selected for patterning, in advance of processing the whole lot of substrates. The send-ahead substrates are developed and measured after exposure, then are stripped and coated with fresh resist for processing along with the other substrates of the lot. While the DBF method of FIG. 6 can be performed at the same time as printing product features, the astigmatism-based method of FIG. 8 (ABF, for short) relies on aberration settings that typically are unsuitable for printing product substrates. The ABF method is therefore a technique better suited to dedicated monitor substrates, or to send-ahead substrates.

In this way, the ABF method as presented in U.S. patent application publication no. US 2016-363871 can be used to measure the focus error of a scanner-type lithographic apparatus. The astigmatism affects the two gratings TH and VH differently. Theoretically, the Bossung of the gratings as measured by the first order diffraction signal and/or other signals from the scatterometer will move away from each other as shown in FIG. 8B and the distance dF between the Bossung tops is proportional to the set value of astigmatism. An astigmatism control parameter is used to apply the aberration setting while printing target patterns from a patterning device MA comprising both horizontal and vertical gratings of the same pitch. Various improvements and alternatives to the ABF method have been disclosed in European patent application no. EP17187069.4, dated Aug. 21, 2017, the entire contents of which is incorporated herein in its entirety. Some of these improvements relate to calibration of the method, for example to correct for drift of focus and astigmatism over time. The methods described in European patent application no. EP17187069.4 can be applied in conjunction with the teaching of the present disclosure.

Scatterometry using the apparatus of FIG. 5 and the ABF method of FIG. 8 allows focus measurement with high precision and throughput. The ABF method can be used to measure focus for monitoring performance and applying advanced process control corrections in EUV-based lithographic manufacturing. Other methods of measurement that are not dependent on astigmatism can also be applied, however, as already mentioned.

Based on the above principles, many different focus metrology targets and target pairs can be designed, that will provide focus-sensitive diffraction signals in the manner illustrated in FIG. 8. The methods using these target designs in combination with appropriate illumination and signal processing, can be applied to accurately measure, monitor and control the focus fingerprint of a lithographic apparatus. Interfield and/or intrafield focus fingerprints may be measured and reported separately, if desired. The improved focus fingerprints can be used to exploit the potential of techniques such as the ABF technique for high-volume, high-density focus measurements, and so enable advanced process control and computational metrology techniques. The targets are not limited in application to the ABF technique, as will be further explained below.

Design Variations

FIGS. 9 to 15 present a number of variations on the cell patterns that may be deployed in the dense zones and/or sparse zones of focus metrology targets of the general types shown in FIG. 8. Different designs may be suited to different measurement techniques and different process environments. Different process environments for this purpose may include physically different processes, and/or different design rules. In each Figure, cell patterns of the (A) version of FIGS. 9-13 and 15 are designed for use in dense zones, while cell patterns of the (B) version of FIGS. 9-13 and 15 are more suited to sparse zones. It will be understood that "dense" and "sparse" are relative terms, and no absolute level of density or sparseness is implied by these terms. Having said that, a certain level of contrast between the dense zones and the sparse zones is a significant parameter for obtaining sufficiently strong diffraction signals for the higher orders (+1, −1 etc.).

In all of these drawings, the dimensions and numbers of features in each cell pattern are schematically represented, and not intended to be to scale. To give an idea of dimensions that might be used in practice, each target structure (grating TH, TV or T) may be several tens of microns, for example 40 microns, on each side. This allows the target to be underfilled by a radiation spot, and allows measurement using pupil image sensor 19 in the scatterometer of FIG. 5. As explained above, smaller targets can be used such that the whole composite target is overfilled by the radiation spot, when the different diffraction orders are captured by darkfield imagine using field image sensor 23 of the scatterometer of FIG. 5. These small target structures may be for example several microns on each side, for example 4 or 5 microns.

The pitch (period) of the repeating arrangement of zones may be greater than or equal to 350 nm, for example 600 nm. If the dense zones and sparse zones are equal in width, then each zone may be, say, 300 nm in width. The cell pattern for each zone may be defined to be the same width as the zone, as shown schematically in FIG. 8A, or it may be a submultiple of the width of the zone. For example, a cell pattern may be 100 nm in size, so that three repetitions of the cell pattern will fit across a 300 nm-wide zone. The dimensions of the cell patterns for the dense zones and the sparse zones need not be the same. The cell patterns need not be square or rectangular. The orientation of the cell pattern may change between the target structures of a pair (TH, TV, for example).

In FIG. 9A the first features in the dense zones are lines 1106 or chopped lines 1108. The first features 1106 or 1108 comprise lines with a width corresponding to a minimum dimension of the first features and a length longer than the minimum dimension. In the case of the chopped lines 1108, each feature has a width corresponding to the minimum dimension and a length longer than the minimum dimension but less than, say, one quarter of a period of the periodic array formed by the arrangement of dense and sparse zones (T, TH, TV). In the case of chopped lines, the segments can be aligned (seen at left) or staggered (seen at right).

In FIG. 9B, the first features in the sparse zones are also lines 1106 or chopped lines 1108, but fewer in number (density) than in the dense zones. As mentioned, there is no need for the form of the first features to be the same between the dense zones and the sparse zones of a given target. There is also no need for both zones to have first features, if the design rules would permit a solid dense zone, or a sparse zone that is empty. That is to say, if first zones within the repeating arrangement have the first features, it is optional whether the second zones also have the first features with a different density.

In the examples of FIG. 9, the cell patterns have a primary direction of periodicity (vertical, as illustrated). It is optional whether these patterns would be used in this orientation in both horizontal gratings TH and vertical gratings TV, or whether the orientation of the cell pattern would be rotated so that each target TH and TV is a rotated version of the other within the cell patterns, or only in the arrangement of the dense zones and sparse zones.

In FIG. 10A, different cell patterns having first features with a more two-dimensional character are presented. First features 1206 in the dense zones have the same minimum dimension in both directions. Again, the features can be aligned (seen at upper left) or staggered (seen at upper right). In another example having a more fully two-dimensional character, the first features 1208 and 1210 include two or more line segments having widths corresponding to the minimum dimension, and having different orientations. In the particular example, line segments having different orientations form junction features with one another, similar in form to functional product features elsewhere on the substrate. In the illustrated example, some first features 1208 comprise different line segments joined with a T-junction, while other first features 1210 comprise different line segments joined to form an elbow. Cross-shaped features may be formed, and U- and S-shaped features too. The cell pattern can be designed to mimic part of specific product patterns on the same substrate, or generic "product-like" features may be used.

In FIG. 10B, the first features in the sparse zones are also product-like features the same as the features 1206, 1208 and 1210, but fewer in number (density) than in the dense zones. As mentioned, there is no need for the form of the first features to be the same between the dense zones and the sparse zones of a given target. There is also no need for the both zones to have first features, if the design rules would permit a dense zone that is solid, or a sparse zone that is empty.

FIG. 11A illustrates a solid cell pattern that may be used to fill a dense zone, if design rules permit. FIG. 11B illustrates an empty cell pattern that may be used to fill a sparse zone, if design rules permit. Either of these cell patterns can be used in the corresponding zones instead of those illustrated in FIGS. 9 and 10. On the other hand, a target that is completely solid in the dense zones and completely empty in the sparse zones would be simply a conventional grating, and would be outside the scope of an aspect of the present disclosure.

FIG. 12A illustrates a further class of cell patterns that may be used in the dense zones of a focus metrology target as described above. These cell patterns include first features 1406 similar to the lines 1106 of FIG. 9, or first features 1408 similar to the chopped lines 1108 of FIG. 9. Additionally, overall feature density in the dense zones is increased by the addition of second features 1420, 1422, which are significantly larger, for example two or three or more times wider than the first features, in their minimum dimension. As a result, in targets based on these cell patterns, the dense zones include a repeating arrangement of second features, a minimum dimension of each second feature being at least twice the minimum dimension of the first features. In the different examples illustrated in FIG. 12A, second features labeled 1420 are broad lines oriented transversely to the lines or chopped lines that are the first features. Second features labeled 1422 are broad lines oriented in parallel with the lines or chopped lines that are the first features. In the case of chopped lines, seen in the middle row of cell patterns, these may be separated from the second features (left cell pattern), or joined to them (right cell pattern).

The purpose of the second features is to increase density in the dense zones. This in turn can increase the strength of the diffraction signals that can be detected by the scatterometer, without necessarily adding to the focus sensitivity. Considering these signal strengths in terms of the diffraction efficiency of a grating, the first features are what causes variation of the diffraction efficiency with focus. The second features can be added to shift a baseline diffraction efficiency, onto which that variation is added. Since the density of the second features can be controlled to some extent independently of the density of first features, this type of embodiment provides additional parameters of freedom for a designer to obtain a desired combination of signal strength and focus sensitivity in a given process environment. By respecting the minimum printable dimension of a process, the target designs can be achieved within design rules. (Recall also that the scatterometer cannot resolve the minimum dimension of the first features, only the overall pitch of the arrangement of dense zones and sparse zones.)

FIG. 12B illustrates some cell patterns for sparse zones that may be used in combination with the cell patterns of FIG. 12B. It will be seen that examples of sparse zone cell patterns have been derived from corresponding ones of the dense zone cell patterns, but deleting the second features and reducing the density of first features. This is purely by way of example, however, and there is nothing to prevent the use of completely unrelated cell patterns in the dense zones and sparse zones.

Figures 13A, 13B:
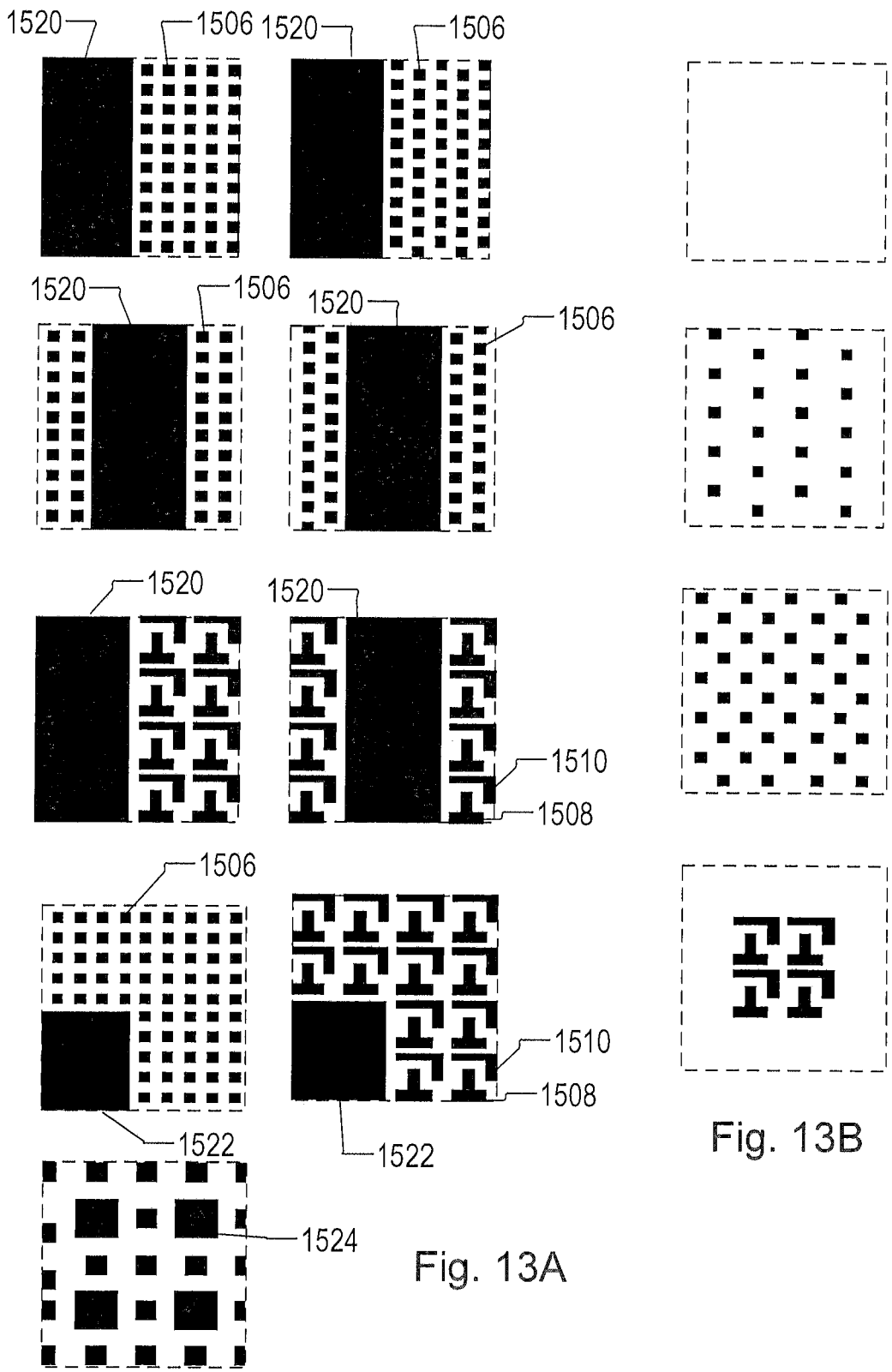
FIG. 13A illustrates further examples of cell patterns for use in dense regions of target structures.
FIG. 13B illustrates further examples of cell patterns for use in sparse regions of target structures.

FIG. 13A illustrates a further class of cell patterns that may be used in the dense zones of a focus metrology target described above. These cell patterns combine first features 1506, 1508, 1510 having a fully two-dimensional character (as in FIG. 10) with the presence of second features 1520, 1522, 1524, which are significantly times wider than the first features in their minimum dimension (as in FIG. 12). As a result, in targets based on these cell patterns, the dense zones include a repeating arrangement of second features, a minimum dimension of each second feature being at least twice the minimum dimension of the first features. In different examples illustrated in FIG. 13A, second features labeled 1520 are broad lines arranged centrally or to one side of the cell pattern to the product-like features that are the first features. Second features labeled 1522 and 1524 are broad features that are themselves two-dimensional in character.

As in FIG. 10, the first features having two-dimensional character may have their minimum dimension in both directions, such as the first features labeled 1506. Alternatively, or in addition, first features having two-dimensional character may include two or more line segments having widths corresponding to the minimum dimension, and having different orientations. Line segments having different orientations may form junction features with one another, similar in form to functional product features elsewhere on the substrate. In the illustrated example, some first features 1508 comprise different line segments joined with a T-junction, while other first features 1510 comprise different line segments joined to form an elbow. A cross would be another type of junction feature that could be included.

As explained for the examples of FIG. 12, the purpose of the second features is to increase density in the dense zones. This in turn can increase the strength of the diffraction signals that can be detected by the scatterometer, without necessarily adding to the focus sensitivity. Since the density of the second features can be controlled to some extent independently of the density of first features, this type of embodiment provides additional parameters of freedom for a designer to obtain a desired combination of signal strength and focus sensitivity in a given process environment. By respecting the minimum printable dimension of a process, the target designs can be achieved within design rules.

FIG. 13B illustrates some cell patterns for sparse zones that may be used in combination with the cell patterns of FIG. 13A. An empty zone is one option, while the other cell patterns have first features of the same form as those in the dense zones, but fewer in number per unit area.

FIG. 14 illustrates yet further examples of cell patterns for use in dense regions of target structures in the processes of FIGS. 8 and 9. These have similar characteristics to those of FIG. 13, but with areas of space 1630 within the cell patterns. The cell patterns also have an asymmetry that may result in focus sensitive asymmetry in the target structure as a whole. Using the ABF technique, and other techniques described below, this focus sensitive asymmetry is not used as the primary basis for focus measurement.

FIG. 15A illustrates yet further examples of cell patterns for use in dense regions of target structures in the processes of FIGS. 8 and 9. FIG. 15B illustrates yet further examples of cell patterns for use in sparse regions of target structures in the processes of FIGS. 8 and 9. These have similar characteristics to those of FIG. 12, but have first features joined asymmetrically to the broader second features.

The cell patterns in FIGS. 14 and 15 all have an asymmetry that may result in focus sensitive asymmetry in the target structure as a whole, which the examples of FIGS. 9 to 13 do not. Using the ABF technique, and other techniques described below, this focus sensitive asymmetry is not used as the primary basis for focus measurement.

As mentioned, in all of the above examples, cell patterns can be used in the orientation shown, or in a different orientation, for example rotated by 90, 180 or 270 degrees.

Enhanced Focus Metrology Methods

As mentioned above, the principles of the present disclosure can be applied in combination with some improvements and alternatives to the ABF method that have been disclosed in European patent application no. EP17187069.4 dated Aug. 21, 2017, the entire contents of which is incorporated herein by reference. Some brief description of the enhanced methods will be provided as further embodiments. The principles of the present disclosure can also be applied in the basic ABF method, if desired.

Figure 16A:
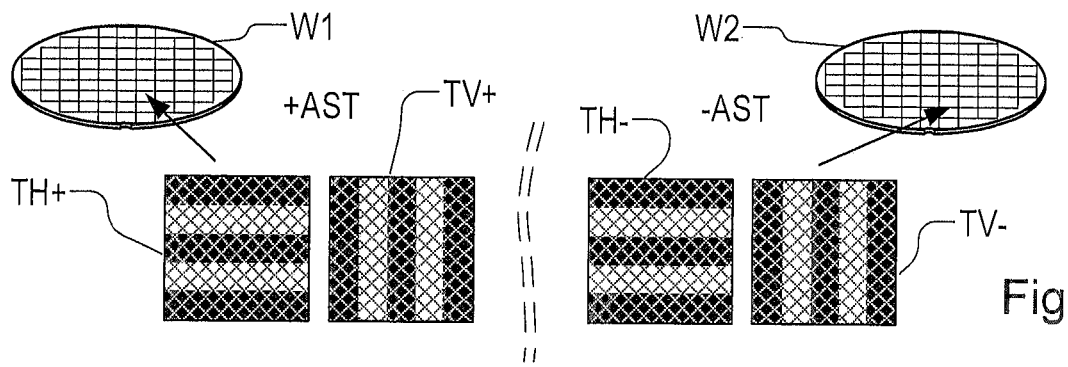
FIG. 16A illustrates the formation of additional target pairs for use in a version of the ABF method having positive and negative aberration settings in an embodiment using two substrates.
Figure 16B:
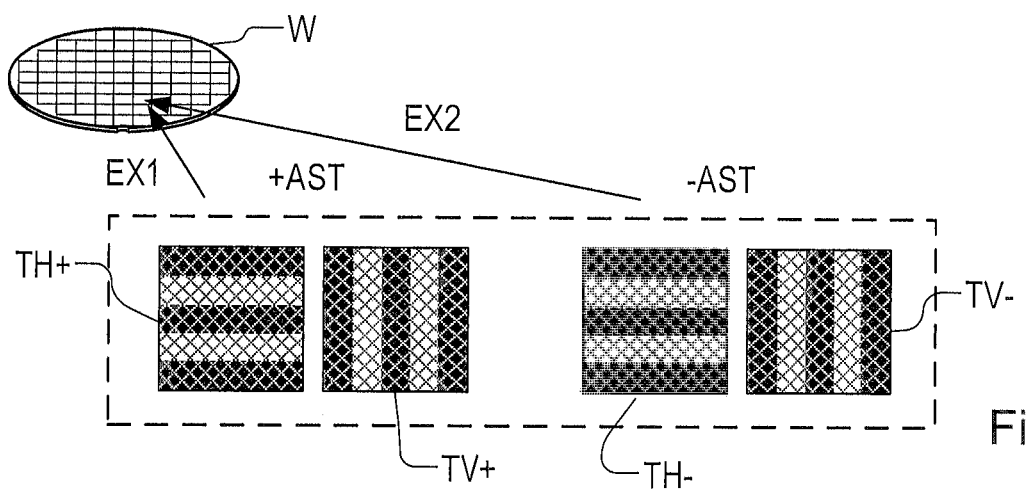
FIG. 16B illustrates the formation of additional target pairs for use in a version of the ABF method having positive and negative aberration settings in an embodiment using two exposures on a single substrate.

FIG. 16 illustrates the formation of additional target pairs for use in an improved version of the ABF method having positive and negative aberration settings. FIG. 16A illustrates an embodiment of the disclosure which uses two substrates. FIG. 16B illustrates an embodiment of the disclosure using two exposures on a single substrate. Based on analysis presented more fully in the European patent application no. EP17187069.4, it is proposed to improve the robustness of ABF measurements against aberration drift and other effects, by combining measurements from pairs of targets that have been printed with opposite values of aberration settings (astigmatism, for example).

FIG. 16A shows two substrates W1, W2, each of which has been printed with pairs of horizontal and vertical gratings for use as targets in focus metrology by the ABF method. On the first substrate W1 a first target TH+ and a second target TV+ have been printed using a first aberration setting that induces a relative best focus offset between the targets. The label +AST indicates this first setting, which is for example a positive astigmatism setting. On the second substrate W1 a second target TH− and a second target TV− have been printed using a second aberration setting that induces a relative best focus offset between the targets. The label −AST indicates this second setting, which is for example a negative astigmatism setting.

The two target pairs TH+, TV+ and TH−, TV− are identical in design, and are printed from the same patterning device under conditions as nearly identical as possible, apart from the opposite aberration settings. In accordance with the principles of the present disclosure, each of the targets comprises a periodic array of features formed by a repeating arrangement of dense zones and sparse zones.

FIG. 16B shows another implementation in which the two pairs of targets TH+, TV+ and TH−, TV− are printed side-by-side on a single substrate W. The first pair of targets TH+, TV+ are printed using a first exposure step EX1 and then the second pair of targets TH−, TV− are printed using a second exposure EX2 in the same resist layer. A small positional offset is applied between the two exposures, so that the targets appear side-by-side in the resist, and not overlaid. Only after both exposures is the substrate removed from the lithographic apparatus and the pattern in the resist material is developed and measured with the scatterometer. This method has an advantage of speed and uses fewer substrates than the example of FIG. 16A, and helps ensure that the performance of the projection system is as unchanged as possible between the pairs of targets. Otherwise, the two implementations are equivalent.

It may be that the positive and negative aberration settings +AST and −AST are equal in magnitude and opposite in sign. While equal and opposite aberration settings are favored, some benefit may be obtained by choosing aberration settings that are at least different in sign, if not equal in magnitude. A difference in sign will in most implementations involve a positive and a negative sign, but in principle one of the aberration settings could be zero and the other one either positive or negative.

In addition to improving robustness against the effects described above, combining measurements from targets printed with both positive and negative aberration settings can mitigate the effect of drift in the aberration performance of the lithographic apparatus. The above method provides a measurement method that is robust against astigmatism drift, but does not in itself provide a measure of astigmatism drift. If a measurement of astigmatism drift is wanted, methods are described in the mentioned European patent application no. EP17187069.4.

Additional pairs of targets can be printed under further different conditions and their measurements combined with those described above, to improve further the robustness of the overall method. It is a matter for the implementer whether the additional printing and measuring overhead is justified by the additional accuracy and/or additional diagnostic information that may be obtained. For example, the method may include printing additional target pairs under different settings such as, for example, pole imbalance in the illumination profile, or introducing an X/Y contrast difference in the scanning operation (scan skew or scan scaling can be introduced). Additionally, some types of errors in the scatterometer optical system can be captured and corrected by measuring the same targets more than once, under different rotations.

Some error sources will be quite static, so that additional exposures and measurements are needed only to refine the calibration information, and not every time a measurement is made. In other cases, it may be desired to print multiple pairs of targets every time.

Figure 17:
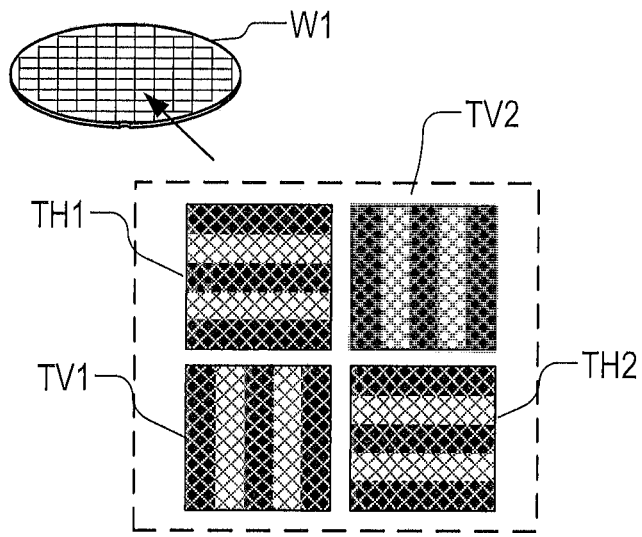
FIG. 17 illustrates an improvement that may be applied in the methods according to various embodiments of the present disclosure.

FIG. 17 shows another target design which includes more than one pair of targets. A first pair of targets comprise horizontal grating TH1 and vertical grating TV1. A second pair of targets comprise horizontal grating TH2 and vertical grating TV2. Each grating is a periodic array of features, formed by a repeating arrangement of dense zones and sparse zones according to the principles of the present disclosure. The gratings of the first pair of targets have different design parameters to those of the second pair. The differences may be in the dimensions of the dense zones and the sparse zones, and/or the differences may be in the detailed form of features within the zones and/or the arrangement of those features.

In the mentioned European patent application no. EP17187069.4, various design differences are mentioned, together with their benefits. Measuring additional targets will of course increase (but not double) the measurement time. If the measurements of the different targets can be done simultaneously, using for example dark-field imaging modes of the inspection apparatus shown in FIG. 3, then the measurement time need not be increased at all.

The techniques of FIGS. 16 and 17 can be combined, using four pairs of targets. The mentioned European patent application no. EP17187069.4 provides examples of how to combine intensities from four target pairs to obtain an average dI/I metric.

Figure 18:
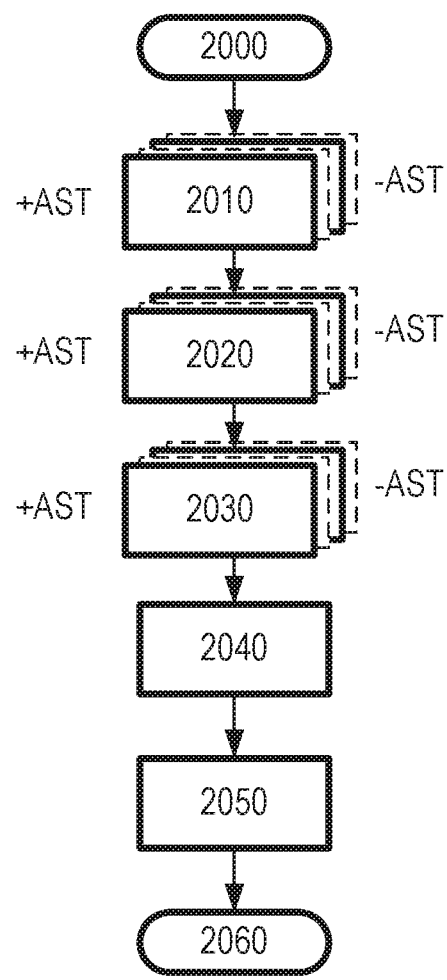
FIG. 18 is a flowchart of a method implementing focus measurement in an embodiment of the disclosure.

FIG. 18 is a flowchart of a method for monitoring a focus parameter during a lithographic process according to an exemplary embodiment of the techniques just described with reference to FIGS. 16 and 17. The method is as follows:
2000—Start.
2010—Print at least a first pair of (H/V) targets with a positive aberration setting and print at least a second pair of targets with a negative aberration setting to print at least two pairs of targets as illustrated in FIG. 16A or FIG. 16B. Optionally print two or more pairs of targets, with different design parameters, as described with reference to FIG. 17;
2020—Perform measurements by inspection of the first targets of each pair of targets (e.g. the horizontal gratings) to obtain first measurement values;
2030—Perform measurements by inspection of the second targets of each pair of targets (e.g. the vertical gratings) to obtain second measurement values;
2040—Calculate focus by combining difference from the first and second pairs of targets to obtain a combined difference metric and using calibration information;
2050—Use calculated focus measurement in focus setting for subsequent exposures.
2060—End.

More detail within these steps is given in the mentioned European patent application no. EP17187069.4.

Focus Metrology Using Focus Offsets and Multiple Exposure

An embodiment of the present disclosure applies a technique that may be applied as an alternative to Astigmatism Based Focus metrology (ABF). As described above, ABF relies on differences in the printing of a pair of targets whose features have different orientations (H and V for short), which can be measured by observing differences in their diffraction signals. When these are measured in the scatterometer, the diffraction signals from the two targets of a pair actually travel through the scatterometer optics along quite different paths. This causes a signal difference that may vary between individual scatterometers. If this happens, then the ABF focus calibration will vary between individual scatterometers. It is highly desirable to have a single calibration for all scatterometers. To address this, some pairs of targets can be measured twice, with a relative 90-degree substrate rotation. Both measurements are combined, to cancel out the differences between H and V response of the scatterometer optics. The need for additional measurements and the substrate rotation step adds undesirably to the focus metrology overhead.

Figure 19A:
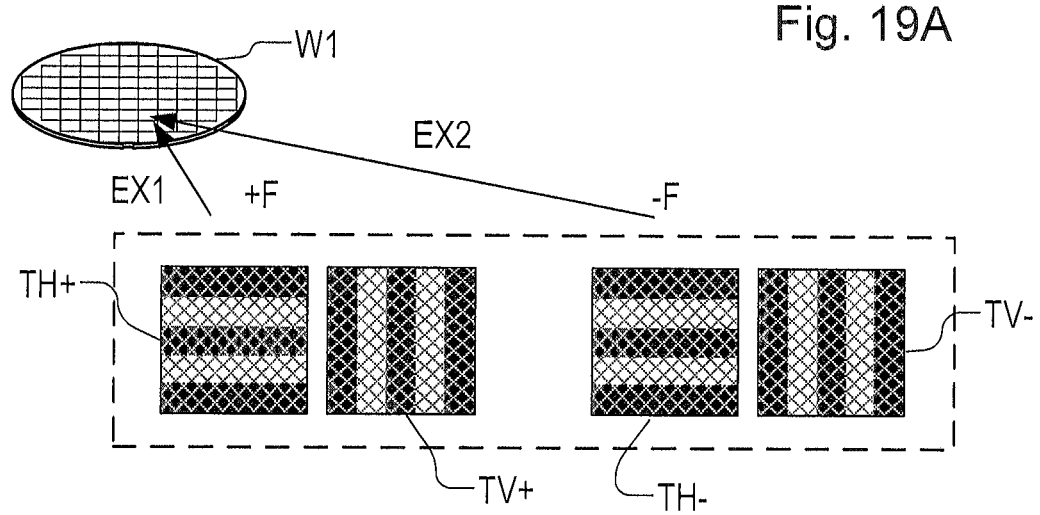
FIG. 19A illustrates the formation of target pairs formed in two exposures on a single substrate, implementing a focus measurement method and/or an aberration measurement method in an embodiment using two pairs of targets

FIG. 19A illustrates the principles of an embodiment, which is based on multiple focus offsets and a multiple exposure technique. A pattern defining one or more periodic arrays of features is printed twice in the same resist (dual exposure). In this example, the pattern defines a horizontal grating TH and a vertical grating TV, as in the ABF technique. The gratings are defined by repeating arrangements of dense zones and sparse zones, as described above. In this embodiment, two pairs of targets TH+, TV+ and TH−, TV− are printed side-by-side on a single substrate W1. The first pair of targets TH+, TV+ are printed using a first exposure step EX1 and then the second pair of targets TH−, TV− are printed using a second exposure EX2 in the same resist layer. The method does not require any aberration setting such as astigmatism to be applied. The method does not require any best focus offset to be induced between the targets of a pair (although that is not excluded). The method does not in principle require pairs of targets at all, per exposure, but the provision of separate H and V gratings provides additional benefits, as described in the mentioned European patent application no. EP17187069.4.

Instead of an aberration setting, a first focus offset, for example a positive focus error +F, is applied when printing the pattern in exposure EX1 to form the first pair of targets TH+, TV+. A second focus offset, for example a negative focus offset F−, is applied when printing the pattern in exposure EX2 to form the second pair of targets TH−, TV−. A small positional offset is applied between the two exposures, so that the targets appear side-by-side in the resist, and not overlaid. Only after both exposures, is the substrate removed from the lithographic apparatus and the pattern in the resist material is developed. The targets produced in this way can be measured individually using a scatterometer, using methods similar to those described above.

As mentioned, the two exposures differ by a programmed focus offset. This focus offset can be realized directly by injecting a certain defocus when controlling the lithographic apparatus. Injecting a defocus will typically result in the substrate being positioned slightly higher or lower than for best focus. The focus offset can also be induced in other ways, if desired, including by astigmatism. Further details of implementation are described in the mentioned European patent application no. EP17187069A. Any suitable combination of focus offsets can be used but equal and opposite focus offsets F+ and F− are a good choice. The magnitude of the focus offset per target is a matter to be defined in a metrology recipe, but it may be for example about half of the astigmatism offset applied in a current ABF technique.

The scatterometer is used to measure certain diffraction signals, for example the first order diffraction signals, when each target is illuminated with a spot of radiation. From the difference and average of these diffraction signals over a calibration substrate (for example FFRFEM substrate as described above), a focus calibration curve is constructed, in a manner similar to that described above. This allows inference of focus error in targets printed in future.

Because the targets within each pair are printed from the same pattern of a patterning device and are measured through the substantially the same path in the scatterometer, the calibration of the above difference metric is insensitive to many sources of error that can affect the ABF method. Because of the need for non-zero focus offsets, the method is not likely to be suitable for measurement on product substrates, but it can be usefully suitable for monitoring substrates and for send-ahead substrates.

As a bonus, by providing two pairs of targets with H and V orientation, additional information can be extracted by combining diffraction signals in a different way, especially information relating to astigmatism performance. Therefore, although the method of FIG. 19 involves two exposures with different focus offsets, compared with a known ABF method with only one exposure, it has an added benefit of providing relatively direct measurement of astigmatism. Details of these methods are given in the mentioned European patent application no. EP17187069.4.

Figure 19B:
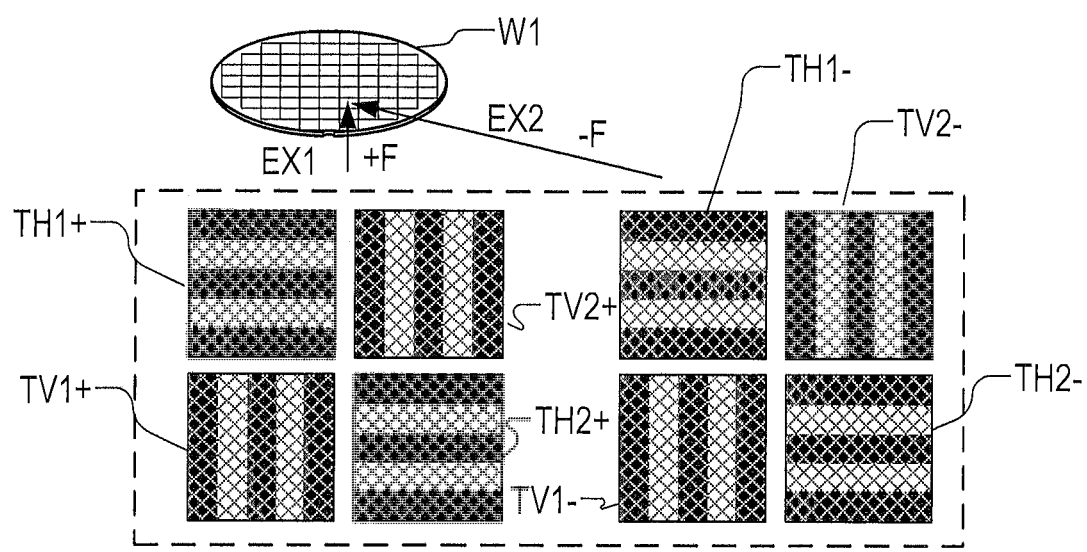
FIG. 19B illustrates the formation of target pairs formed in two exposures on a single substrate, implementing a focus measurement method and/or an aberration measurement method in an embodiment using four pairs of targets.

As shown in FIG. 19B, the principle can be expanded to more than one or two pairs of targets. A target layout with four pairs of targets is shown, in which targets with different design parameters are printed in each exposure EX1, EX2. As in FIG. 17, eight targets in all are printed, and labeled TH1+, TV1+, TH1−, TV1−, TH2+, TV2+, TH2−, TV2−, The letter 'H' or 'V' in each label indicates horizontal or vertical orientation of the grating lines. Suffix '1' or '2' indicates the first or second design parameters, for example different CD and/or pitch. The suffix '+' or '−' in the label indicates which exposure, and consequently which focus offset, was applied in the printing of that grating. At least some of the targets comprise periodic arrays of features formed by dense zones and sparse zones as described above.

Figure 20:
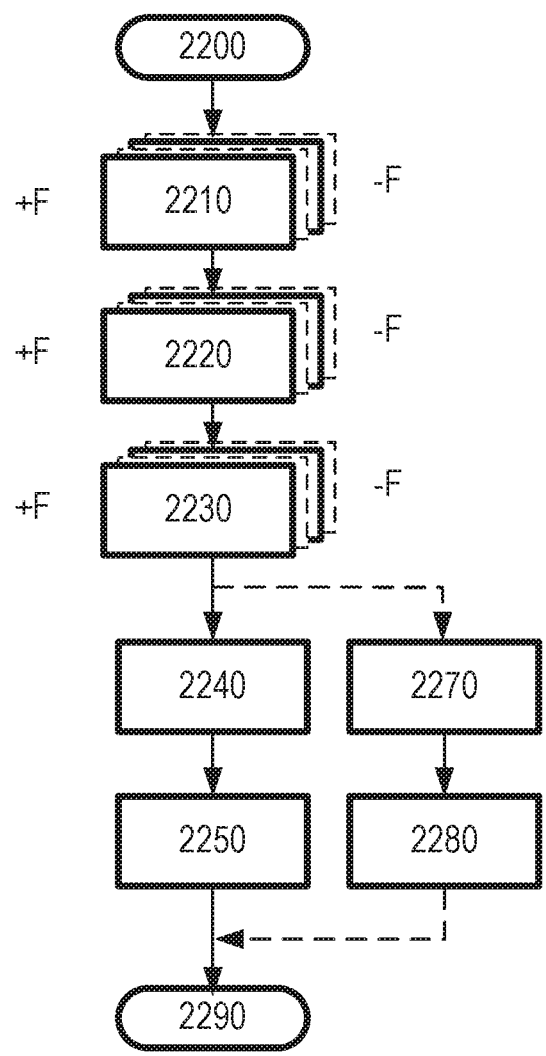
FIG. 20 is a flowchart of a method implementing focus measurement and aberration measurement method in an embodiment of the disclosure.

FIG. 20 is a flowchart of a method for monitoring a focus parameter during a lithographic process according to an exemplary embodiment of the techniques just described with reference to FIGS. 19A and 19B. The method is as follows:

2200—Start.

2210—Print at least a first pair of targets by a sequence of two exposures in the same resist, using different focus offsets in the two exposures, for example a positive focus offset F+ and an equal and opposite negative focus offset F− (optionally print two or more targets in each exposure);

2220—Perform measurements by inspection of the first targets of each pair of targets (e.g. the F+ targets) to obtain first measurement values;

2230—Perform measurements by inspection of the second targets of each pair of targets (e.g. the F− targets) to obtain second measurement values;

2240—Calculate a measurement of focus by combining diffraction signals from a first target and a second target of a pair of targets to obtain a difference metric and using calibration information (optionally combine diffraction signals from two or more pairs of targets to obtain a combined difference metric and/or or multiple difference metrics);

2250—Use the calculated focus measurement in focus setting for subsequent exposures.

2270—Optionally, calculate a measurement of astigmatism by combining diffraction signals from a first target and a second target of a pair of targets to obtain a difference metric and using calibration information (optionally combine diffraction signals from two or more pairs of targets to obtain a combined difference metric and/or or multiple difference metrics so that the measure of astigmatism is more robust);

2280—Optionally, use the calculated astigmatism measurement in calibration and/or astigmatism setting for subsequent exposures.

2290—End,

More detail within these steps is given in the mentioned European patent application no. EP17187069.4.

Figure 21:
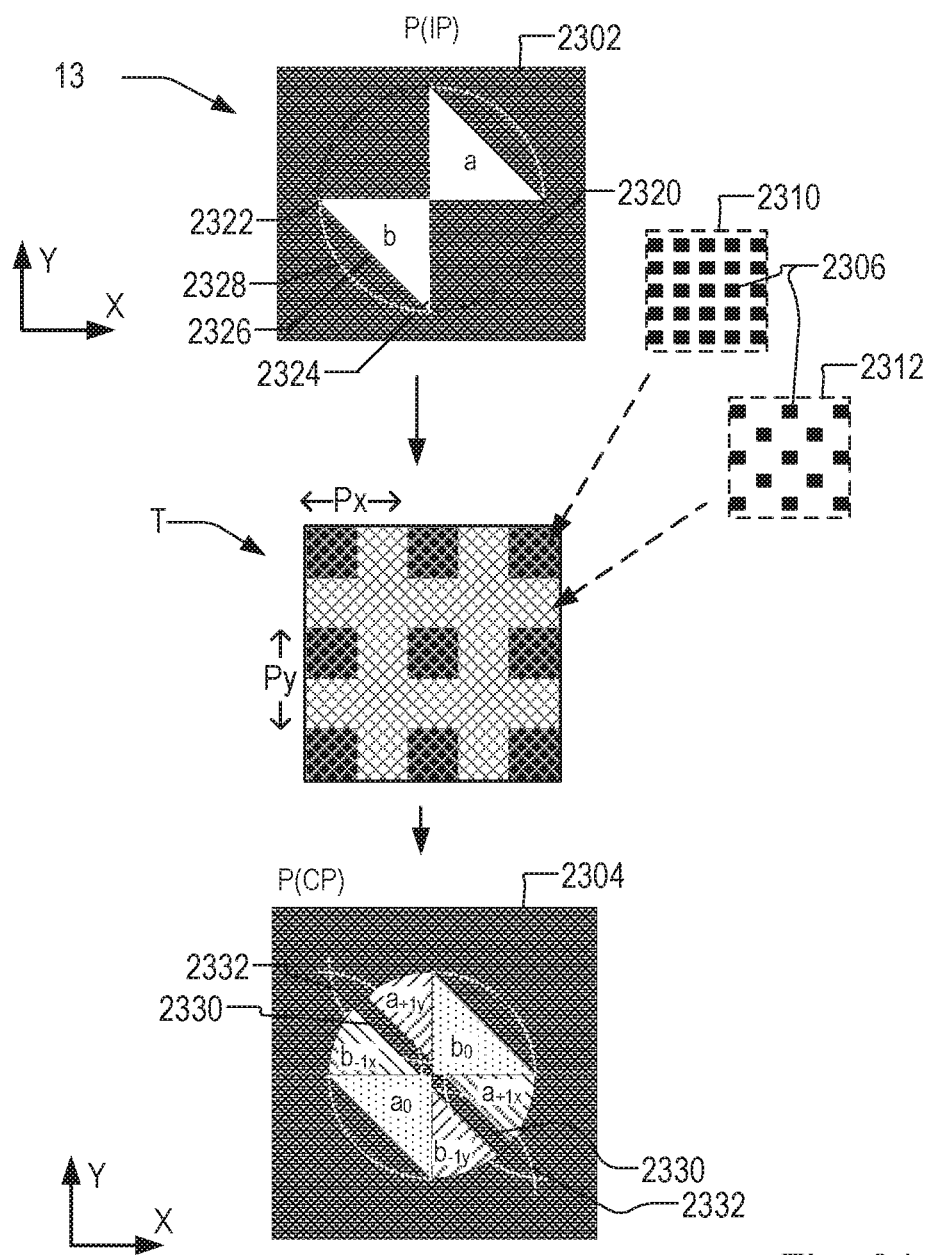
FIG. 21 illustrates a method of obtaining diffraction signals in two directions simultaneously, using the scatterometer of FIG. 3 or FIG. 5 according to an embodiment using a method as described herein.

Measurement Illumination Greater in Directions of Periodicity than Directions Intermediate Between the Directions of Periodicity FIG. 21 presents an embodiment, in which a scatterometer of the type illustrated in FIG. 5 is used to capture positive and negative diffraction orders from one or more focus metrology targets. In this embodiment, a two-dimensional grating T is used, that combines features periodic in both a first direction (say X) and a second direction (Y). Similar to as described above, the grating T comprises a repeating arrangement of zones having a relatively high density of features ("dense zones", indicated by darker hatching and letter D) interleaved with zones having a relatively low density of features ("sparse zones", indicated by lighter hatching and letter 5). The "first zones" may be dense zones while the sparse zones may be the "second zones". Within each of the dense zones there is a repeating arrangement of first features 2306, a minimum dimension of each first feature being close to but not less than a resolution limit of the printing step. As illustrated in the inset details in FIG. 21, a repeating arrangement of first features 2306 in the dense zones is defined by a cell pattern such as the example illustrated at 2310. Similarly, in this example a repeating arrangement of first features in the sparse zones is defined by a cell pattern such as the example illustrated at 2312. The repeating arrangement of different zones, together with the features therein, thus defines a target structure which is periodic in both the first direction (e.g. X) and a second direction (Y).

The cell patterns 2310 and 2312 in FIG. 21 are different to those used in FIG. 8, purely for the sake of example. A variety of cell patterns can be used in different designs, either to arrive at a single target design to suit a range of processes, or to arrive at a target design specifically optimized for a particular process environment, and a particular focus measurement method. Further examples and principles of design have explained and illustrated with reference to FIGS. 9 to 20 above. It depends on the measurement method to be used, as well as design choice, whether first features having a two-dimensional character are favored for use in the zones of a target having a two-dimensional arrangement of zones.

The distribution of inspection illumination in a pupil plane of the illumination path IP (referred to for short as the illumination profile) is illustrated at 2302. As in the embodiments described above such as FIG. 8, a segmented aperture device 13 is used in place of the unipolar apertures 13S and 13N shown in FIG. 5. The principles of using such a segmented aperture are substantially the same as described above. However, the form of the segments in the illumination profile is different than aperture 13B. As before, this segmented illumination profile has two bright segments labeled a and b, that are 180-degree symmetrical to one another. In the X and Y directions from each bright segment the distribution is dark. These directions X and Y correspond to the directions of periodicity of the two-dimensional grating T, which are the directions of diffraction, when the target is illuminated with a spot of inspection radiation. The directions are orthogonal in this example, though in principle they need not be orthogonal, and in principle there could be more than two directions of periodicity.

The segmented illumination in this embodiment differs in that a radial extent of the illuminated regions (bright segments a and b together) is greater in the directions of periodicity than it is in directions intermediate between the directions of periodicity. In this particular example, the bright segments are triangular, rather than segments of a circle. Supposing that circle 2320 represents the limit of the illumination system pupil (NA=1), it will be seen that the corners 2322 and 2324 of the triangle b, for example extend fully to this circle in the X and Y directions. On the other hand, at a point 2326 intermediate between these directions, the bright segment ends at a point well inside the radius of circle 2320. For comparison, the outlines of the circular segments are shown in dotted lines 2328. While each of the illuminated regions has the form of a triangle in this example, other shapes meeting this criterion are possible also. As one example, while the bright triangular regions in the illumination profiles are illustrated as having sharp corners an straight edges, rounded corners and/or bowed edges can be provided, to reduce unwanted scattering effects.

Now, a benefit of this different illumination profile is to reduce (ideally, to avoid) cross-talk between diffraction signals that result from the simultaneous diffraction of radiation in both the first direction and the second direction. When the segmented illumination profile 2302 is used to form a spot of inspection radiation on the two-dimensional grating T, the distribution of radiation in the pupil plane of the collection path CP becomes as shown at 2304. The bright regions $a_0$ and $b_0$ represent zero order diffraction signals from the target. Regions labeled with suffix "+1y" and "−1y" represent +1 and −1 order diffraction signals which have been diffracted in the Y direction which is one direction of periodicity of the grating T. At the same time, bright regions labeled with suffix "−1×" and "−1×" represent +1 and −1 order diffraction signals which have been diffracted in the X direction, which is another direction of periodicity of the grating T.

Due to the restricted radial extent of the bright segments a and b in the illumination profile, in directions intermediate between the directions of periodicity, the higher order diffraction signals are also restricted in extent, so that they do not overlap in the regions 2330. As illustrated by the dotted white outlines 2332, the same angles of diffraction would cause overlapping of different orders and therefore interference between the different diffraction signals, in the case of the rounder segments shown in FIG. 8A. The fact that the triangular segments do not overlap in the same way illustrates that this modified illumination profile allows desired diffraction signals to be obtained under a wider range of wavelength and grating pitch conditions, even in the presence of two-dimensional gratings.

Figure 22:
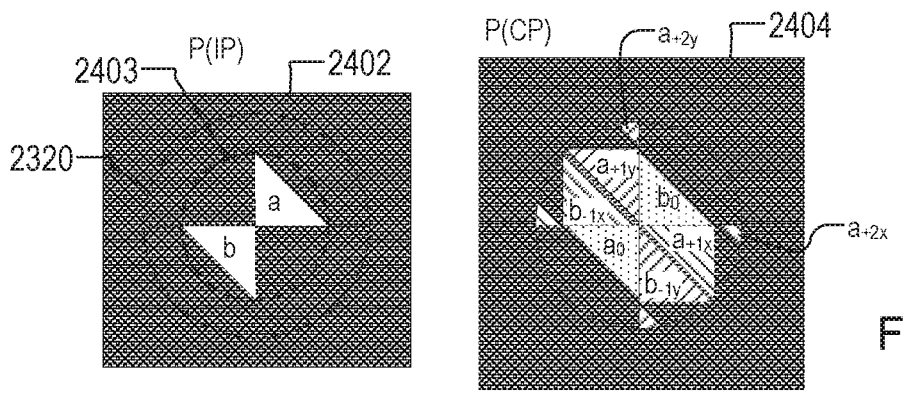
FIG. 22 illustrates a modified illumination profile according to a variant of an embodiment of the disclosure.

FIG. 22 illustrates a further modified illumination profile 2402 and the resulting diffraction pattern 2404 in the pupil of the collection path CP. Suppose that, compared with the situation illustrated in FIG. 21, the wavelength of radiation is shorter, and/or the period of the grating T is longer. The diffraction angles become less, so that first order diffraction signals etc. move closer to the zero order signals in each direction in the detected diffraction pattern 2404. Second order signals $a_{+2y}$ and $a_{+2x}$ also begin to fall within the aperture of the detection system. Even with the triangular segmented illumination profile of FIG. 21, the different diffraction orders would overlap in the pupil, leading to interference between different diffraction signals. For this situation, the distribution of illumination can be restricted further in the radial extent, as shown by circle 2403. Combined with the reduced radial extent of the bright segments in the directions between the directions of periodicity, the illumination profile allows diffraction signals for both directions to be obtained without interference, even with the shorter wavelength of radiation, and/or longer pitch of grating.

Returning to FIG. 21 and the design of grating T in this embodiment, the first features 2306 in this example have a same minimum extent in both the X direction and the Y direction. They are similar in form to contact hole features that might be found as product features elsewhere on the same substrate. The first features need not have the same dimension in both directions. The first features 2306, individually, are shown identical between the dense zone cell pattern 2310 and the sparse zone cell pattern 2312, only fewer in number. As will be seen from further examples, above, the first features need not be the same in the zones of different densities. Furthermore, one or other of the zones of different densities could be entirely without first features.

In this embodiment, the widths of the dense zones and sparse zones are shown as equal, and the widths/heights of the repeating cell patterns are shown as equal too. The widths of the dense zones and sparse zones need not be equal, as they are shown. The widths/heights of the repeating cell patterns need not be equal, either. The periods Px and Py of the target are shown as being equal in both directions, but they need not be the same.

The facility to obtain diffraction signals in two or more different directions simultaneously from the same periodic array of features can be exploited in different ways. One benefit is that diffraction signals from the different diffraction directions travel through different paths in the inspection apparatus (scatterometer). By combining these different diffraction signals together, measurements of focus or other parameters can be obtained that are more robust against imperfections within the inspection apparatus. While the two-dimensional target grating T of this embodiment has an advantage that the diffraction signals for two directions can be acquired simultaneously from a single grating, the one-dimensional targets TH and TV as described above will typically provide stronger diffraction signals, for a similar design and process environment. Therefore, it will depend on each situation, which target is better to use.

Based on the above principles, many different focus metrology targets and target pairs can be designed, that will provide focus-sensitive diffraction signals in the manner illustrated in FIG. 21. The methods using these target designs in combination with appropriate illumination and signal processing, can be applied to accurately measure, monitor and control the focus fingerprint of a lithographic apparatus. Interfield and/or intrafield focus fingerprints may be measured and reported separately, if desired. The improved focus fingerprints can be used to exploit the potential of techniques such as the ABF technique for high-volume, high-density focus measurements, and so enable advanced process control and computational metrology techniques.

Figure 23:
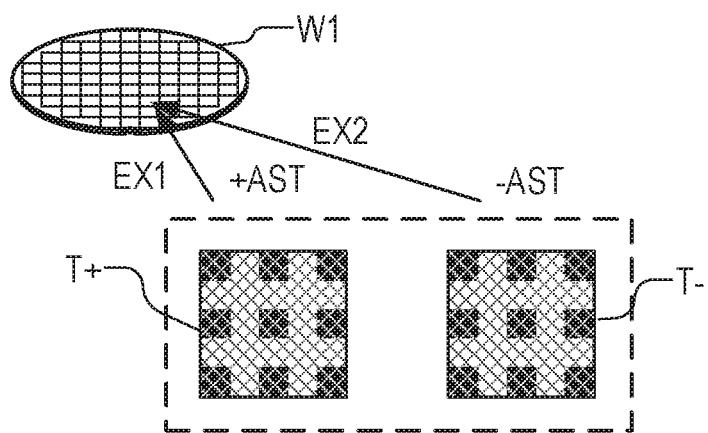
FIG. 23 illustrates the formation of a target pair for use in the method of FIGS. 16 to 18, in accordance with an embodiment of the disclosure.

The targets having two-dimensional arrangements of zones of different density are not limited in application to the ABF technique. FIG. 23 illustrates a pair of targets T+ and T−, each having the form of target T in FIG. 21, printed with different aberration settings in a variation of the +AST/−AST method of FIGS. 16 to 18. Similarly, FIG. 24 illustrates a pair of targets T+ and T−, each having the form of target T in FIG. 21, printed with different focus settings in a variation of the +F/−F method of FIGS. 19 and 20.

Figure 24:
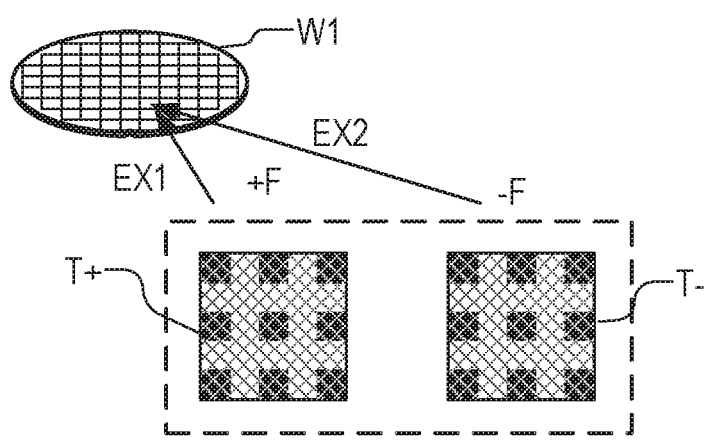
FIG. 24 illustrates the formation of a target pair for use in the method of FIGS. 19 and 20, in accordance with an embodiment of the disclosure.
Figure 25A:
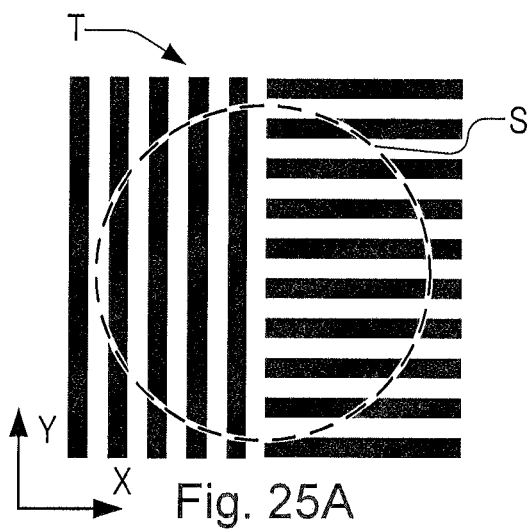
FIG. 25A, FIG. 25B, FIG. 25C, FIG. 25D and FIG. 25E each illustrate different target designs that may be used in the methods of an embodiment of the disclosure.
Figure 25B:
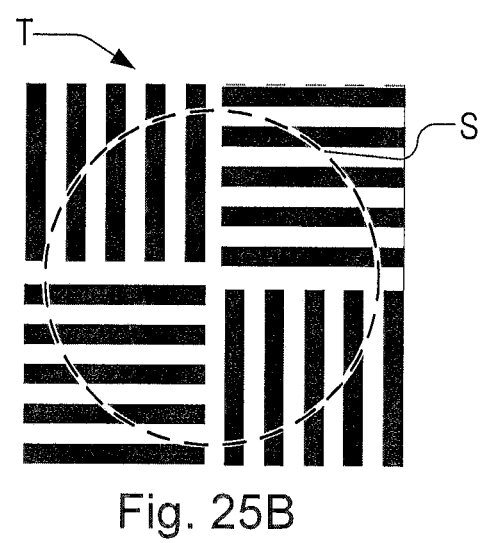
Figure 25C:
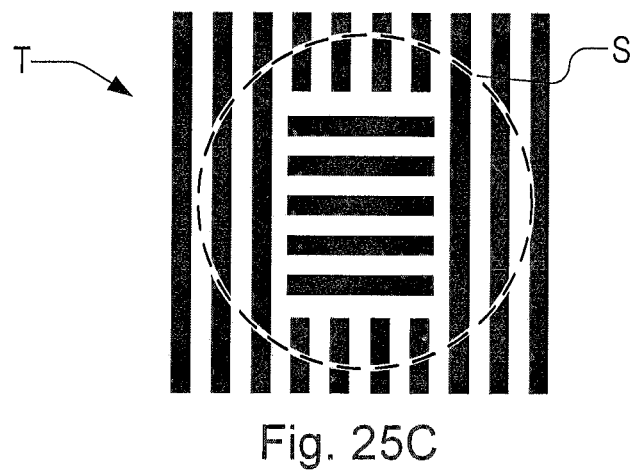
Figure 25D:
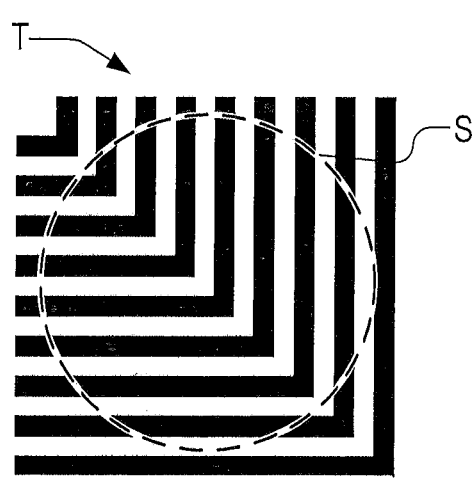
Figure 25E:
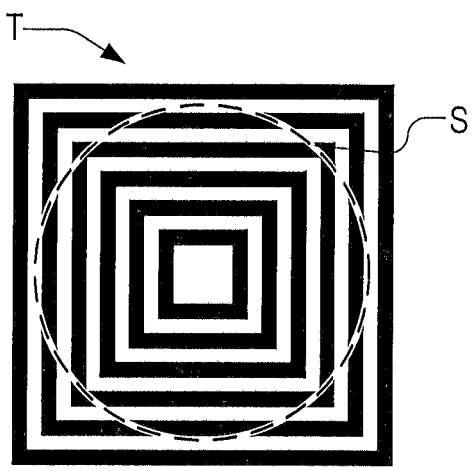

While FIGS. 21, 23 and 24 show an arrangement of zones which is two-dimensional in character across the whole target, targets which are two-dimensional in character can also be made by providing an arrangement of zones which is one-dimensional in character with a first direction of periodicity in a given region of the target, and one-dimensional in character with a second direction of periodicity in another region.

FIGS. 25A to 25E illustrate some variations of targets of this type. Each target T has one or more regions with zones arranged with a first direction of periodicity aligned with the X axis, and one or more other regions with zones arranged in a second direction of periodicity, aligned with the y-axis. A circle S represents the illumination spot of the inspection apparatus, for example the scatterometer apparatus of FIG. 5. As can be seen, within the pupil of the scatterometer, diffraction signals will be obtained in both directions. It may be seen that the targets T of FIG. 25 comprise one or more first periodic arrays of features comprising first zones and second zones as described above, plus one or more second periodic arrays of features, comprising third zones and fourth zones as described above. The difference, compared with the earlier embodiments, is that the first periodic array(s) and the second periodic array(s) are small enough and close enough together to be read as a single target within the spot S of the inspection apparatus. The spot S may have a diameter for example of 20 nm, or 30 or 40 nm. The arrangements of FIGS. 25D and 25E may be beneficial over the arrangements FIG. 25A to 25C, in that they may maximize the use of the spot area.

With reference to FIG. 25, it is noted that it is not necessary that the spot S is smaller than the target. In specific embodiments, spot S may be larger than the target. It is also noted that it is not necessary to measure in the pupil plane of the scatterometer, measurements may also be taken in the image plane. In particular, for the measurement of overlay, similar targets can be used with gratings in different layers and a spot S that does partially not overlap with the target can be used to measure the overlay by recording signals in the image plane of the scatterometer. Examples of such overlay measurements are disclosed in, for example, U.S. patent application publication no. US 2016-0334715, which is hereby incorporated by reference in its entirety. For the measurement of overlay as described in U.S. patent application publication no. US 2016-0334715, a bias may be introduced between the gratings in the different layers. Alternatively, different areas of a single target may have different biases to measure overlay according to the methods described in U.S. patent application publication no. US 2016-0334715. For example, for the target of e.g. FIG. 25E, the grating of a layer of a left triangular quadrant of the target has a bias with respect to the other layer of the target and, at the same time, the grating of the layer of a right triangular quadrant of that target has an opposite bias with respect to the other layer. Thereby increased edge effects can be prevented. Based on the teaching of U.S. patent application publication no. US 2016-0334715, the skilled person is capable of modifying the target further to further decrease the edge effects.

Figure 26:
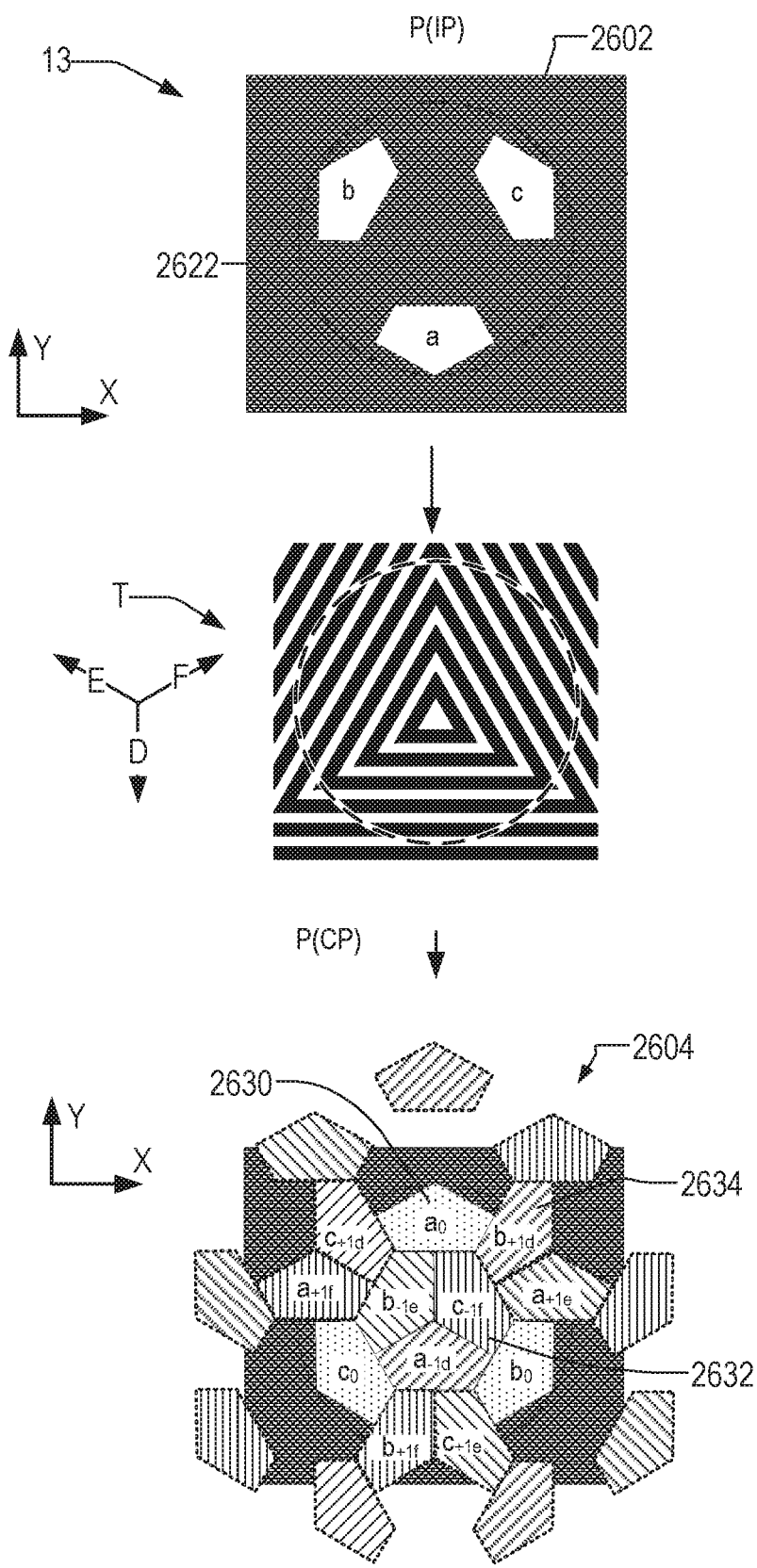
FIG. 26 illustrates a variant of the method of FIG. 21, in which diffraction signals are obtained in three directions simultaneously.

Referring now to FIG. 26, it was mentioned above that in principle there could be more than two directions of periodicity in embodiments described above with respect to FIGS. 21-25, and the directions of periodicity need not be orthogonal. FIG. 26 presents a variation of a two-dimensional grating T described with respect to FIG. 21, that combines features periodic in three directions. The grating T comprises in each region a repeating arrangement of zones having different densities, or simple bars and spaces. The direction of periodicity is different in three regions, corresponding to the three directions labelled D, E, F. The directions are 120 degrees apart.

The distribution of inspection illumination in a pupil plane of the illumination path IP (referred to for short as the illumination profile) is illustrated at 2602. A segmented aperture device 13 is used in place of the unipolar apertures 13S and 13N shown in FIG. 5. The principles of using such a segmented aperture are substantially the same as described above. For use with the three-directional target, this segmented illumination profile has three bright segments labeled a, b and c, that are 120-degrees symmetrical to one another. In the three directions D, E, F from each bright segment the distribution is dark. These directions correspond to the directions of periodicity of the two-dimensional grating T, which are the directions of diffraction, when the target is illuminated with a spot of inspection radiation.

The segmented illumination in this variant again has a characteristic that a radial extent of the illuminated regions (bright segments a, b and c together) is greater in the directions of periodicity than it is in directions intermediate between the directions of periodicity. As mentioned already, rounded corners and/or bowed edges can be provided to the bright segments, to reduce unwanted scattering effects. Referring for comparison to FIG. 22, the radial extent of the bright segments can be restricted to a smaller radius than the radius NA=1, represented by circle 2622.

When the segmented illumination profile 2602 is used to form a spot of inspection radiation on the two-dimensional grating T, the distribution of radiation in the pupil plane of the collection path CP becomes as shown at 2604. The bright regions 2630 labeled $a_0$, $b_0$ and $c_0$ represent zero order diffraction signals from the target. Regions 2632 labeled $a_{-1d}$, $b_{-1e}$ and $c_{-1f}$ in the center of the pupil represent −1 order diffraction signals which have been diffracted in the D, E and F directions respectively from the segments a, b and c. In an outer region of the pupil, +1 order diffraction signals 2634 fall at least partly within the pupil, in spaces between the zero order signals. Other +1 and −1 diffraction orders are illustrated but not labelled.

Due to the restricted radial extent of the bright segments a, b and c in the illumination profile, in directions intermediate between the directions of periodicity D, E and F, the higher order diffraction signals are also restricted in extent, so that they do not overlap with other diffraction signals, in the central regions 2332 or in the outer regions 2634. The fact that the diffracted segments do not overlap in the same way illustrates that this modified illumination profile allows desired diffraction signals to be obtained under a wider range of wavelength and grating pitch conditions, even in the presence of two-dimensional gratings.

The target T having three directions of periodicity may comprise arrangements of zones of different density including zones comprising first features and/or second features as described above with respect to, e.g., FIGS. 9-15. The first and second features and the cell patterns may be adapted to the three directions of periodicity, if desired. The targets having three directions of periodicity could be formed of simple bars, or segmented bars, for measuring overlay and other properties unrelated to focus or aberration.

CONCLUSION

The above techniques address a variety of problems in the measurement of focus and/or aberration performance in a lithographic manufacturing facility.

An aspect of the disclosure provides focus metrology targets that are compatible with typical design rules, and therefore suitable for focus monitoring in high-volume manufacture. The focus metrology targets may be defined by patterns on patterning devices (e.g. reticles) or in maskless patterns stored in digital form.

The specification that the certain features of the metrology targets have a minimum dimension close to but not less than a resolution limit of the printing step should not be taken to exclude the possibility that so-called "assist features" are provided on the patterning device, which by themselves do not print, but which enhance the printing of the features which are large enough to be printed.

An aspect of the disclosure provides a method and apparatus for inspecting target structures, with reduced risk of interference between diffraction signals in different directions.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

Further embodiments of the invention are disclosed in the list of numbered embodiments below:

1. A method of measuring focus performance of a lithographic apparatus, the method comprising:

(a) using the lithographic apparatus to print at least a first focus metrology target on a substrate, the printed focus metrology target including at least a first periodic array of features;

(b) using inspection radiation to obtain one or more diffraction signals from the first periodic array in the printed focus metrology target; and (c) deriving a measurement of focus performance based at least in part on the diffraction signals, wherein the first periodic array comprises a repeating arrangement of first zones interleaved with second zones in at least a first direction of periodicity, a feature density being different in the first zones and the second zones, and wherein each of the first zones includes a repeating arrangement of first features, a minimum dimension of each first feature being close to but not less than a resolution limit of the printing step.

2. The method according to embodiment 1, wherein the first zones and second zones are interleaved only in the first direction of periodicity.

3. The method according to embodiment 1 or embodiment 2, wherein the focus metrology target further includes a second periodic array of features, wherein the second periodic array comprises a repeating arrangement of third zones interleaved with fourth zones, a feature density being different in the third zones and the fourth zones, wherein each of the third zones includes a repeating arrangement of third features, a minimum dimension of each third feature being close to but not less than a resolution limit of the printing step, and wherein using the inspection radiation to obtain one or more diffraction signals further includes obtaining one or more diffraction signals from the second periodic array in the printed focus metrology target.

4. The method according to embodiment 3, wherein the third zones are interleaved with the fourth zones in a second direction of periodicity orthogonal to the first direction of periodicity.

5. The method according to embodiment 3 or embodiment 4, wherein the feature density in the first zones and third zones is the same, and the feature density in the second zones and fourth zones is the same.

6. The method according to embodiment 5, wherein the second periodic array is the same as the first periodic array but rotated ninety degrees.

7. The method according to embodiment 3, wherein the third zones are interleaved with the fourth zones in the first direction of periodicity, the first periodic arrangement of features and the second periodic arrangement of features differing in one or more design parameters.

8. The method according to embodiment 1 or embodiment 2, wherein the first zones and second zones are interleaved in the first direction of periodicity and in a second direction of periodicity orthogonal to the first direction of periodicity.

9. The method according to any of embodiments 1 to 8, wherein the first features in the first zones comprise lines with a width corresponding to the minimum dimension and with a length longer than the minimum dimension.

10. The method according to embodiment 9, wherein the first features in the first zones comprise chopped lines, each feature having a width corresponding to the minimum dimension and a length longer than the minimum dimension but less than one quarter of a period of the first periodic array.

11. The method according to any of embodiments 1 to 10, wherein the first features include line segments having a width corresponding to the minimum dimension and having different orientations.

12. The method according to embodiment 11, wherein at least some of the line segments having different orientations form junction features with one another.

13. The method according to any of embodiments 1 to 8, wherein the first features comprise features having the minimum dimension in two dimensions.

14. The method according to any of embodiments 1 to 13, wherein each of the second zones also includes a repeating arrangement of features whose minimum dimension is close to but not less than the resolution limit of the printing step.

15. The method according to embodiment 14, wherein the features in the second zones are similar in form to the first features in the first zones, but provided in a different density.

16. The method according to any of embodiments 1 to 15, wherein the feature density is greater in the first zones than in the second zones.

17. The method according to embodiment 16, wherein each of the first zones further includes a repeating arrangement of second features, a minimum dimension of each second feature being at least twice the minimum dimension of the first features.

18. The method according to any of embodiments 1 to 17, wherein the diffraction signals are obtained using radiation having a wavelength longer than 150 nm while the minimum dimension of the first features is less than 40 nm.

19. The method according to any of embodiments 1 to 18, wherein the inspection radiation has a wavelength longer than 150 nm, while a wavelength of radiation to print the focus metrology pattern is less than 20 nm.

20. The method according to any of embodiments 1 to 19, wherein the period of the first periodic array of features in the focus metrology pattern is greater than 350 nm.

21. The method according to embodiment 2, wherein the focus metrology target further includes a second periodic array of features, the second periodic array comprising a repeating arrangement of third zones interleaved with fourth zones, a feature density being different in the third zones and the fourth zones, wherein each of the third zones includes a repeating arrangement of third features, a minimum dimension of each third feature being close to but not less than a resolution limit of the printing step, and wherein the first focus metrology target is printed by the lithographic apparatus with an aberration setting that induces a relative best focus offset between the first periodic array and the second periodic array.

22. The method according to embodiment 21, wherein the diffraction signals include signals representing an intensity of a diffraction order of radiation scattered from the first periodic array and signals representing an intensity of a corresponding diffraction order of radiation scattered from the second periodic array.

22a. The method according to embodiment 22, wherein in using the inspection radiation to obtain one or more diffraction signals the first periodic array and the second periodic array are illuminated simultaneously as a single target, and the diffraction signals scattered from the first periodic array and the diffractions signals scattered from the second periodic array are captured simultaneously.

23. The method according to embodiment 8 or any of embodiments 9 to 20 when dependent on embodiment 8, wherein the first focus metrology target is printed by the lithographic apparatus with at least a first aberration setting that induces a relative best focus offset between having the first direction of periodicity and features having the second direction of periodicity.

24. The method according to embodiment 23, wherein the diffraction signals include signals representing an intensity of a diffraction order of radiation scattered in the first direction of periodicity from the periodic array and signals representing an intensity of a diffraction order of radiation scattered in the second direction of periodicity from the second periodic array.

24a. The method according to embodiment 24, wherein in using the inspection radiation to obtain one or more diffraction signals the first periodic array and the second periodic array are illuminated simultaneously as a single target, and the diffraction signals scattered from the first periodic array and the diffractions signals scattered from the second periodic array are captured simultaneously.

25. The method according to any of embodiments 1 to 20, wherein a second focus metrology target is printed on the same or a different substrate using a second aberration setting of the lithographic apparatus that has a different sign than the first aberration setting, and wherein diffraction signals from the first and second metrology patterns are combined so as to determine the focus parameter in a manner that is insensitive to a drift in aberration performance of the lithographic apparatus.

26. The method according to any of embodiments 1 to 20, wherein the first focus metrology target and a second focus metrology target are printed by printing a target pattern two times in the same resist layer on a substrate, changing a focus offset and adding a positional offset so that the second focus metrology target is adjacent but offset from the first focus metrology target.

27. The method according to any of embodiments 1 to 26, wherein the method is repeated at multiple locations across a substrate, thereby to measure variation of focus performance of the lithographic apparatus across the substrate.

28. The method according to any of embodiments 1 to 27, wherein the method is performed on monitoring substrates, the measurements of focus performance being used to apply focus corrections in the processing of product substrates.

29. The method according to any of embodiments 1 to 28, wherein patterns defining the focus metrology target(s) do not comprise features which in using the inspection radiation to obtain one or more diffraction signals introduce focus-dependent asymmetry in the diffraction signals from the first periodic array.

30. A method of manufacturing devices wherein a device pattern is applied to a series of substrates using a lithographic process, the method including:

using the method of any of embodiments 1 to 29 to monitor the focus parameter, and controlling the lithographic process for later substrates in accordance with the determined focus parameter.

31. A patterning device for use in a lithographic apparatus, the patterning device comprising contrasting portions that when printed by the lithographic apparatus define features of one or more device patterns and one or more metrology patterns, the one or more metrology patterns including at least a first focus metrology target, the first focus metrology target including at least a first periodic array of features, wherein the first periodic array comprises a repeating arrangement of first zones interleaved with second zones in at least a first direction of periodicity, a feature density being different in the first zones and the second zones, and wherein each of the first zones includes a repeating arrangement of first features, a minimum dimension of each first feature being close to but not less than a resolution limit of the printing by the lithographic apparatus.

32. The patterning device according to embodiment 31, wherein the first zones and second zones are interleaved only in the first direction of periodicity.

33. The patterning device according to embodiment 31 or embodiment 32, wherein the focus metrology target further includes a second periodic array of features, wherein the second periodic array comprises a repeating arrangement of third zones interleaved with fourth zones, a feature density being different in the third zones and the fourth zones, and wherein each of the third zones includes a repeating arrangement of third features, a minimum dimension of each third feature being close to but not less than a resolution limit of the printing step.

34. The patterning device according to embodiment 33, wherein the third zones are interleaved with the fourth zones in a second direction of periodicity orthogonal to the first direction of periodicity.

35. The patterning device according to embodiment 33 or embodiment 34, wherein the feature density in the first zones and third zones is the same, and the feature density in the second zones and fourth zones is the same.

36. The patterning device according to embodiment 35, wherein the second periodic array is the same as the first periodic array but rotated ninety degrees.

37. The patterning device according to embodiment 33, wherein the third zones are interleaved with the fourth zones in the first direction of periodicity, the first periodic arrangement of features and the second periodic arrangement of features differing in one or more design parameters.

37a. The patterning device according to embodiment 31 or embodiment 32, wherein the first zones and second zones are interleaved in the first direction of periodicity and in a second direction of periodicity orthogonal to the first direction of periodicity.

38. The patterning device according to any of embodiments 31 to 37a, wherein the first features in the first zones comprise lines with a width corresponding to the minimum dimension and with a length longer than the minimum dimension.

39. The patterning device according to embodiment 38, wherein the first features in the first zones comprise chopped lines, each feature having a width corresponding to the minimum dimension and a length longer than the minimum dimension but less than one quarter of a period of the first periodic array.

40. The patterning device according to any of embodiments 31 to 39, wherein the first features include line segments having a width corresponding to the minimum dimension and having different orientations.

41. The patterning device according to embodiment 40, wherein at least some of the line segments having different orientations form junction features with one another.

42. The patterning device according to any of embodiments 31 to 37, wherein the first features comprise features having the minimum dimension in two dimensions.

43. The patterning device according to any of embodiments 31 to 42, wherein each of the second zones also includes a repeating arrangement of features whose minimum dimension is close to but not less than the resolution limit of the printing by the lithographic apparatus.

44. The patterning device according to embodiment 43, wherein the features in the second zones are similar in form to the first features in the first zones, but provided in a different density.

45. The patterning device according to any of embodiments 31 to 44, wherein the feature density is greater in the first zones than in the second zones.

46. The patterning device according to embodiment 45, wherein each of the first zones further includes a repeating arrangement of second features, a minimum dimension of each second feature being at least twice the minimum dimension of the first features.

47. The patterning device according to any of embodiments 31 to 46, wherein the period of the first periodic array of features in the focus metrology pattern is greater than 350 nm.

48. The patterning device according to embodiment 32, wherein the focus metrology target further includes a second periodic array of features, the second periodic array comprising a repeating arrangement of third zones interleaved with fourth zones, a feature density being different in the third zones and the fourth zones, wherein each of the third zones includes a repeating arrangement of third features, a minimum dimension of each third feature being close to but not less than a resolution limit of the printing by the lithographic apparatus.

48a. The patterning device according to embodiment 48, wherein the first periodic array and the second periodic array are provided within a single target area for inspection by a spot of radiation having a diameter of, for example, 20 nm, 30 nm or 40 nm.

49. The patterning device according to any of embodiments 31 to 48, wherein patterns defining the focus metrology target(s) do not comprise features which, in the printing by the lithographic apparatus, introduce focus-dependent asymmetry in the first periodic array.

50. The patterning device according to any of embodiments 31 to 49, wherein the contrasting portions are reflective and non-reflective portions with respect to radiation of a wavelength in the range 5 to 20 nm.

51. A method of manufacturing devices wherein a device pattern is applied to a series of substrates using a lithographic process, the method including:

using the patterning device of any of embodiments 31 to 50 to monitor a performance parameter of the lithographic process, and controlling the lithographic process for later substrates in accordance with the determined performance parameter.

While specific embodiments of the invention have been described above, it will be appreciated that an embodiment of the invention may be practiced otherwise than as described. For example, an embodiment of the invention may take the form of a computer program containing one or more sequences of machine-readable instructions enabling a system to cause performance of one or more step of a method as disclosed above, or a data storage medium (e.g. semiconductor memory, magnetic or optical disk) having such a computer program stored therein.

The breadth and scope of the present invention should not be limited by any of the above-described exemplary embodiments, but should be defined only in accordance with the following claims and their equivalents.

The invention claimed is:

1. A method comprising:

using a lithographic apparatus to print at least a first focus metrology target on a substrate, the printed focus metrology target including at least a first periodic array of features;

using inspection radiation to obtain one or more diffraction signals from the first periodic array in the printed focus metrology target; and deriving a measurement of focus performance of the lithographic apparatus based at least in part on the diffraction signals, wherein the first periodic array comprises a repeating arrangement of first zones interleaved with second zones in at least a first direction of periodicity, a feature density being different in the first zones and the second zones, and wherein each of the first zones includes a repeating arrangement of first features, a minimum dimension of each first feature being close to but not less than a resolution limit of the printing step, and wherein the first and second zones are arranged such that an illumination spot of the inspection radiation is arranged to illuminate both the first and second zones at a same time.

2. The method of claim 1, wherein the first zones and second zones are interleaved only in the first direction of periodicity.

3. The method of claim 1, wherein the focus metrology target further includes a second periodic array of features, wherein the second periodic array comprises a repeating arrangement of third zones interleaved with fourth zones, a feature density being different in the third zones and the fourth zones, wherein each of the third zones includes a repeating arrangement of third features, a minimum dimension of each third feature being close to but not less than a resolution limit of the printing step, and wherein using the inspection radiation to obtain one or more diffraction signals further includes obtaining one or more diffraction signals from the second periodic array in the printed focus metrology target.

4. The method of claim 3, wherein the third zones are interleaved with the fourth zones in a second direction of periodicity orthogonal to the first direction of periodicity.

5. The method of claim 3, wherein the feature density in the first zones and third zones is the same, and the feature density in the second zones and fourth zones is the same.

6. The method of claim 5, wherein the second periodic array is the same as the first periodic array but rotated ninety degrees.

7. The method of claim 3, wherein the third zones are interleaved with the fourth zones in the first direction of periodicity, the first periodic arrangement of features and the second periodic arrangement of features differing in one or more design parameters.

8. The method of claim 1, wherein the first features in the first zones comprise lines with a width corresponding to the minimum dimension and with a length longer than the minimum dimension.

9. The method of claim 8, wherein the first features in the first zones comprise chopped lines, each first feature having a width corresponding to the minimum dimension and a length longer than the minimum dimension but less than one quarter of a period of the first periodic array.

10. The method of claim 1, wherein the first features include line segments having a width corresponding to the minimum dimension and having different orientations.

11. A method of manufacturing devices wherein a device pattern is applied to a series of substrates using a lithographic process, the method including:
   using the method of claim 1 to monitor the focus parameter, and
   controlling the lithographic process in accordance with the determined focus parameter.

12. A patterning device for use in a lithographic apparatus, the patterning device comprising contrasting portions that when printed by the lithographic apparatus define features of one or more device patterns and one or more metrology patterns, the one or more metrology patterns including at least a first focus metrology target, the first focus metrology target including at least a first periodic array of features,
   wherein the first periodic array comprises a repeating arrangement of first zones interleaved with second zones in at least a first direction of periodicity, a feature density being different in the first zones and the second zones, and
   wherein each of the first zones includes a repeating arrangement of first features, a minimum dimension of each first feature being close to but not less than a resolution limit of the printing by the lithographic apparatus, and
   wherein the first and second zones are arranged such that an illumination spot of inspection radiation is arranged to illuminate both the first and second zones at a same time.

13. The patterning device of claim 12, wherein the first zones and second zones are interleaved only in the first direction of periodicity.

14. The patterning device of claim 12, wherein the focus metrology target further includes a second periodic array of features,
   wherein the second periodic array comprises a repeating arrangement of third zones interleaved with fourth zones, a feature density being different in the third zones and the fourth zones, and
   wherein each of the third zones includes a repeating arrangement of third features, a minimum dimension of each third feature being close to but not less than a resolution limit of the printing by the lithographic apparatus.

15. The patterning device of claim 14, wherein the third zones are interleaved with the fourth zones in a second direction of periodicity orthogonal to the first direction of periodicity.

16. The patterning device of claim 14, wherein the feature density in the first zones and third zones is the same, and the feature density in the second zones and fourth zones is the same.

17. The patterning device of claim 16, wherein the second periodic array is the same as the first periodic array but rotated ninety degrees.

18. The patterning device of claim 14, wherein the third zones are interleaved with the fourth zones in the first direction of periodicity, the first periodic arrangement of features and the second periodic arrangement of features differing in one or more design parameters.

19. The patterning device of claim 12, wherein the first zones and second zones are interleaved in the first direction of periodicity and in a second direction of periodicity orthogonal to the first direction of periodicity.

20. The patterning device of claim 12, wherein the first features in the first zones comprise lines with a width corresponding to the minimum dimension and with a length longer than the minimum dimension.

* * * * *